(12) United States Patent
Liu et al.

(10) Patent No.: US 7,700,473 B2
(45) Date of Patent: Apr. 20, 2010

(54) GATED SEMICONDUCTOR DEVICE AND METHOD OF FABRICATING SAME

(75) Inventors: Shih-Chang Liu, Alian Township (TW); Ming-Hui Shen, Dounan Town (TW); Chi-Hsin Lo, Zhubei (TW); Chia-Shiung Tsai, Hsin-Chu (TW); Yi-Shin Chu, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 452 days.

(21) Appl. No.: 11/784,633

(22) Filed: Apr. 9, 2007

(65) Prior Publication Data
US 2008/0248620 A1 Oct. 9, 2008

(51) Int. Cl.
*H01L 21/3205* (2006.01)
*H01L 21/4763* (2006.01)

(52) U.S. Cl. ............ 438/595; 438/201; 438/211; 438/257; 438/593; 438/945; 257/E21.035; 257/E21.038; 257/E29.129; 257/E29.3; 257/E21.68

(58) Field of Classification Search .......... 257/E21.035, 257/E21.038, E29.129, E29.3, E21.68; 438/595, 438/945, 201, 211, 257, 593
See application file for complete search history.

(56) References Cited

U.S. PATENT DOCUMENTS

| 6,617,085 | B1 * | 9/2003 | Kanh et al. | 430/5 |
| 6,844,602 | B2 * | 1/2005 | Kwon | 257/395 |
| 6,878,613 | B2 * | 4/2005 | Stottko et al. | 438/592 |
| 7,074,692 | B2 * | 7/2006 | Chen et al. | 438/440 |
| 2004/0029354 | A1 * | 2/2004 | You et al. | 438/424 |
| 2008/0121954 | A1 * | 5/2008 | Shuto | 257/295 |

* cited by examiner

*Primary Examiner*—Michelle Estrada
(74) *Attorney, Agent, or Firm*—Slater & Matsil, L.L.P.

(57) ABSTRACT

A method for fabricating a gated semiconductor device, and the device resulting from performing the method. In a preferred embodiment, the method includes forming a hard mask for use in gate formation on one or more layers of alternately insulating and conducting material that have been formed on a substrate. The hard mask preferably includes three layers; a lower nitride layer, a middle oxide, and an upper nitride layer. In this embodiment, the middle oxide layer is formed with the rest of the hard mask, and then reduced in a lateral dimension, preferably using a DHF dip. A dielectric layer formed over the gate structure, including the hard mask, then etched back, self-aligns to be reduced-dimension oxide layer. In addition, where two conducting, that is gate layers are present, the lower layer is laterally reduced in dimension on at least one side to create an undercut.

12 Claims, 25 Drawing Sheets

GATED SEMICONDUCTOR DEVICE AND METHOD OF FABRICATING SAME

TECHNICAL FIELD

The present invention relates generally to the field of semiconductor devices, and relates more particularly to flash memory cells and similar gated structures, which according to the present invention are fabricated in a fashion found to provide for a wider spacer-etching process window and to have other advantageous characteristics, especially when applied to semiconductor devices having relatively-small features.

BACKGROUND

Flash memory cells are a type of semiconductor device. Generally, semiconductor devices are very small components, or collections of components, formed on a piece of semiconductor material often referred to as the substrate. Flash memory cells, for example, feature a gate structure formed on the substrate, as will be explained in more detail below. In many current applications, the substrate is a round, thin slice of silicon or some similar material that has been cut from an ingot formed for this purpose. The substrate material is then selectively treated to give it its semiconducting properties.

A semiconductor is a material that conducts electricity only under certain conditions, such as the application of an electrical charge. To make use of this property, various portions of the substrate are treated with impurities such as boron or phosphorus ions. Layers of conductive and insulating material are then added, each layer to be shaped into the tiny structures that form electronic components such as diodes, transistors, and capacitors. These components may then be interconnected to form integrated circuits.

Using current practices, a wafer that may, for example, measure 15-20 cm in diameter is populated with a number, perhaps several dozen dice. Each die, after fabrication, contains thousands if not millions of tiny interconnected electrical components. When formation of these components is largely complete, the dice will be separated from each other to be packaged and used individually. External connections are provided for so that that the integrated circuits on each packaged die may be used for its intended function.

One such function is memory. A memory device includes a collection of components that may be placed in one or more electrical states that represent a certain value. Individual components in semiconductor memory devices may be placed in a state representing either a logical one or a zero. Collections of such devices, however, may be used to represent a much wider range of values. These values can be read and, often, changed repeatedly to a different value. There are several types of semiconductor-based memory devices.

The different types of memory device may be characterized by function, with each device naturally having a structure and composition operable to perform this function. Random access memory (RAM) involves an array of memory devices that are individually programmable to represent given values. In a RAM device, these values may be changed continually within the operational parameters of the system. Read-only memory (ROM) devices are programmed to contain specific values that may then be read, for example, when an electronic appliance is turned on, but programmed values may not be changed.

This is now true only in a sense, however, as more-recently developed devices, although traditionally referred to as ROM, may be reprogrammed, that is, provided with different values than those that were initially set. An EEPROM (electronically-erasable read only memory), for example, stores values in an array of cells that may be reprogrammed by erasing the contents (value) of one or more cells and re-programming the value stored in each cell. Note the word "electronically" simply refers to the fact that an erase operation is performed by application of an electrical charge. (Other methods, for example, include exposure to light of a certain quality.) It is also noted that the EEPROM is not, strictly speaking, a "read-only" type of memory device; the nomenclature simply reflects that it evolved from earlier designs that were, and the distinction often has little relevance.

One type of EEPROM memory device is referred to as a flash memory device. A flash memory is useful because, although an array of cells store values individually, they can by design be erased in blocks for reprogramming if desired. This greatly increases the operating speed of the device. The present invention, as mentioned above, relates to the structure and fabrication of flash cells. A short description of their operation and traditional structure follows.

FIG. 1 is a simplified schematic diagram illustrating an exemplary flash cell 10. Flash cell 10 is formed on substrate 15, in which a source region 16 and a drain region 18 have been created by the doping process. A gate structure 20 includes a floating gate 22 disposed above the substrate is between the source region 16 and the drain region 18, but physically separated from them by an oxide layer 21. The floating gate 22 is formed of, for example polycrystalline silicon ("poly") or some other conductive material. The oxide layer 21 may be formed of, for example, silicon dioxide ($SiO_2$). A control gate 24 is disposed above the floating gate 22, the two gates being separated by a thin oxide layer 23. In this example, the control gate 24 is coupled to an external electrical connector called a wordline 26. A bit line 28 is coupled to the drain region 18; the source region 16 is connected to ground.

In operation, the charge passing through floating gate 22 is monitored by a cell sensor and, when a sufficient charge is allowed to pass, indicates a logical one. If a negative charge is allowed to accumulate on the floating gate, it acts as a barrier and the charge passing through drops, causing the flash cell 10 to be read as a logical zero. A sufficient voltage applied to the wordline 26, and hence control gate 24, however, clears the accumulated charge and permits the flash cell 10 to return to a logical one state—erasing its contents. Wordline 26' may be coupled to a great many cells like flash cell 10, permitting them all to be erased at the same time.

The structure of another exemplary flash cell is shown in FIG. 2. FIG. 2 is a side view of a flash cell 40, illustrating this exemplary semiconductor device in cross-section. In this example, flash cell 40 includes two gate structures 30 and 50 formed on substrate 44. Each gate structure is, in this view, a mirror image of the other. Gate structure 30 includes a floating gate 32 and a control gate 34 separated by oxide layer 33. A dielectric layer 35 is disposed directly on control gate 34. Similarly, gate structure 50 includes a floating gate 52 separated by oxide layer 53 from control gate 54 and features a dielectric layer 55 disposed over control gate 54.

Erase gate 49 is positioned between gate structure 30 and gate structure 50, and is disposed above oxide structure 48, which is an expanded portion of oxide layer 45. Vertical dielectric spacers 38 and 58 separate gate structures 30 and 50, respectively, from erase gate 49. As should be apparent, in operation a voltage applied to erase gate 49 erases both gate structure 30 and gate structure 50. Erasure may also be performed on only one of gate structures 30 or 50 using wordline structures 36 or 56, respectively. Wordline structure 36 is physically separated from gate structure 30 by spacer 31, and wordline structure 56 from gate structure 50 by spacer 51. Spacers 39 and 59 are disposed on the exterior of wordline structures 36 and 56, respectively. In the flash cell 40, there is a common source region 43, and two drain regions; drain region 41 associated with floating gate 32 and drain region 42 associated with floating gate 52.

In FIG. 2, also shown are the electrical contacts associated with various elements of the flash cell 40. These contacts are typically metal and provide a location for making reliable electrical connections. Here, contacts 37, 47, and 57 serve, respectively, wordline structure 36, erase gate 49, and wordline structure 56. The flash cell 40 is fabricated in a series of steps, which will be briefly described as background to explaining the present invention. FIG. 3 is a flow diagram illustrating a typical method 60 of fabricating a flash memory cell such as flash cell 40 shown in FIG. 2. In this example, a substrate is doped (step 62) with the appropriate impurities to create a source and drain regions. Naturally, more than one type of dopant application may be required, and if so, they will not typically be done at the same time. These source and drain regions may also be formed later in the process; a single step is recited here for purposes of simplicity. An oxide layer is then formed (step 64). This will typically be deposited over the entire wafer surface, and then the undesirable portions will be removed in a selective etching process (not shown).

To fabricate the gate structure (see FIG. 2), a floating gate layer is formed (step 66), for example of poly, followed by a layer of oxide or some other dielectric (step 68), and a control gate poly layer (step 70). A dielectric layer is then formed (step 72) on the control gate poly layer 70. Again, any of the material layers recited in this basic process may include more than one sub layer, and these sub-layers, if present, will likely be formed in separate process steps (not shown). A photoresist layer is then formed and patterned (step 74) for selective etching.

An etching process is then performed (step 76), leaving only the protected gate structures. The remaining photoresist is then removed (step 78). Spacers may be formed (step 80) at this time, using a similar deposition and selective etching technique (steps not separately shown). Another poly layer is then deposited to form the erase gate and wordline structures (step 82). Additionally, spacers outside the wordline structures are added (step 84), and contacts formed (step 86) on the appropriate gates. The contacts are typically metal structures added to facilitate the termination of electrical connections to various parts of the device. The resulting flash cell is illustrated in FIG. 2.

Although adequate, this method and structure have disadvantages in certain applications. For example, in designs that use very small structures, for example having critical dimensions of approximately 90 nm, there remains only a narrow etching process window for spacer etching. In addition, with such small nodes, reverse tunneling performance problems may also become significant. Needed, therefore, is a flash cell structure and fabrication method that tends to widen the spacer-etching window and improve RTV performance. The present invention provides just such a solution.

SUMMARY OF THE INVENTION

These and other problems are generally solved or circumvented, and technical advantages are generally achieved, by preferred embodiments of the present invention that have been found to produce an optimum gate dielectric spacer height, widening the spacer etching process window without a significant increase in manufacturing cost or time, and to reduce failure due to reverse tunneling voltage (RTV).

In accordance with a preferred embodiment of the present invention, a method for fabricating a semiconductor device comprises forming an oxide layer on a semiconductor substrate, forming a first and a second poly (polycrystalline silicon) gate layer separated by an inter-gate dielectric, forming a hard mask including an oxide layer between two nitride layers, reducing a lateral dimension of the oxide layer relative to at least the upper nitride layer, forming a gate structure using the hard mask, and forming a dielectric layer over the gate structure. The dielectric layer preferably includes three layers in an ONO configuration, that is, having a nitride layer between two oxide layers, and after formation is etched back to expose the top of the hard mask in separate the spacer dielectric layer in two separate gate spacers. The method may further include laterally etching the first poly layer to create and undercut near the base of the gate structure. In a preferred embodiment, there are two such gate structures, and the undercut is formed on the exterior side of both of them. An oxide layer, subsequently formed over the gate structure, including the undercut exterior side of the first poly layer, conforms to the undercut side in a manner that creates a uniform region of oxide material adjacent the exterior side of the first poly layer.

In this embodiment, after the formation of the uniform oxide material region, an erase gate is formed between the two gate structures, and a wordline structure is formed on the exterior side of each of the gate structures. Additional dielectric spacers may then be added to the outside of the wordline structures to create a flash memory cell. The flash memory cell in this embodiment uses a common source region formed in the substrate adjacent to and between the two gate structures. This, and the drain regions formed in the substrate adjacent to exterior sides of the two gate structures, may be created as part of the method of the present invention, and may be formed at any logically consistent time during performance of the method.

In accordance with another preferred embodiment of the present invention, a semiconductor device comprises at least one gate structure, the gate structure including an oxide layer separating a first poly layer from a semiconductor substrate, and an inter-gate dielectric layer separating the first poly layer from a second poly layer. In this embodiment, a hard mask including an oxide layer between two nitride layers is disposed above the second poly layer. The middle oxide layer of the hard mask is reduced in lateral dimension relative to at least be nitride layer above it, so that a dielectric gate spacer formed on each side of the gate structure conforms to the preferably I-shaped hard mask, and self-aligns to the top of the reduced dimension oxide layer during formation. The dielectric gate spacers may be etched back to expose the top surface of the hard mask, and otherwise cover the sides of the respective gate structures except at their base, where one or both sides of the first poly layer portion of the gate structure are etched back laterally to create an undercut. The oxide layer, in this embodiment, is disposed over at least the undercut portion of the gate structure to create a uniform-thickness region. This uniform-thickness region, preferably present on the exterior side of each of the two gate structures, has been found to discourage RTV failure.

As more complete appreciation of the present invention and the scope thereof can be obtained from the accompanying drawings that are briefly summarized below, the following detailed description of the presently preferred embodiments of the present invention, and the appended claims.

BRIEF DESCRIPTION OF THE DRAWINGS

For a more complete understanding of the present invention, and the advantages thereof, reference is now made to the following descriptions taken in conjunction with the accompanying drawing, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely a dual-gate flash memory cell. The invention may also be applied, however, to other, similar semiconductor devices as well.

The present invention, then, is directed to a method for fabricating a semiconductor device, specifically a method for forming a flash memory cell or similar structure that in one embodiment provides an improved spacer-formation process window without adding significantly to manufacturing cost, and at the same time reduces the risk of reverse-tunneling voltage failure. Note, however, that while a single pair of flash memory gates will be used to illustrate the present invention, a semiconductor chip embodying the present invention typically thought not necessarily contains a great number of such devices, although this is not necessarily the case. In another embodiment, the present invention is a gated semiconductor device resulting from performing the fabrication method according to an embodiment of the invention. Exemplary embodiments will now be illustrated.

Figure 4:
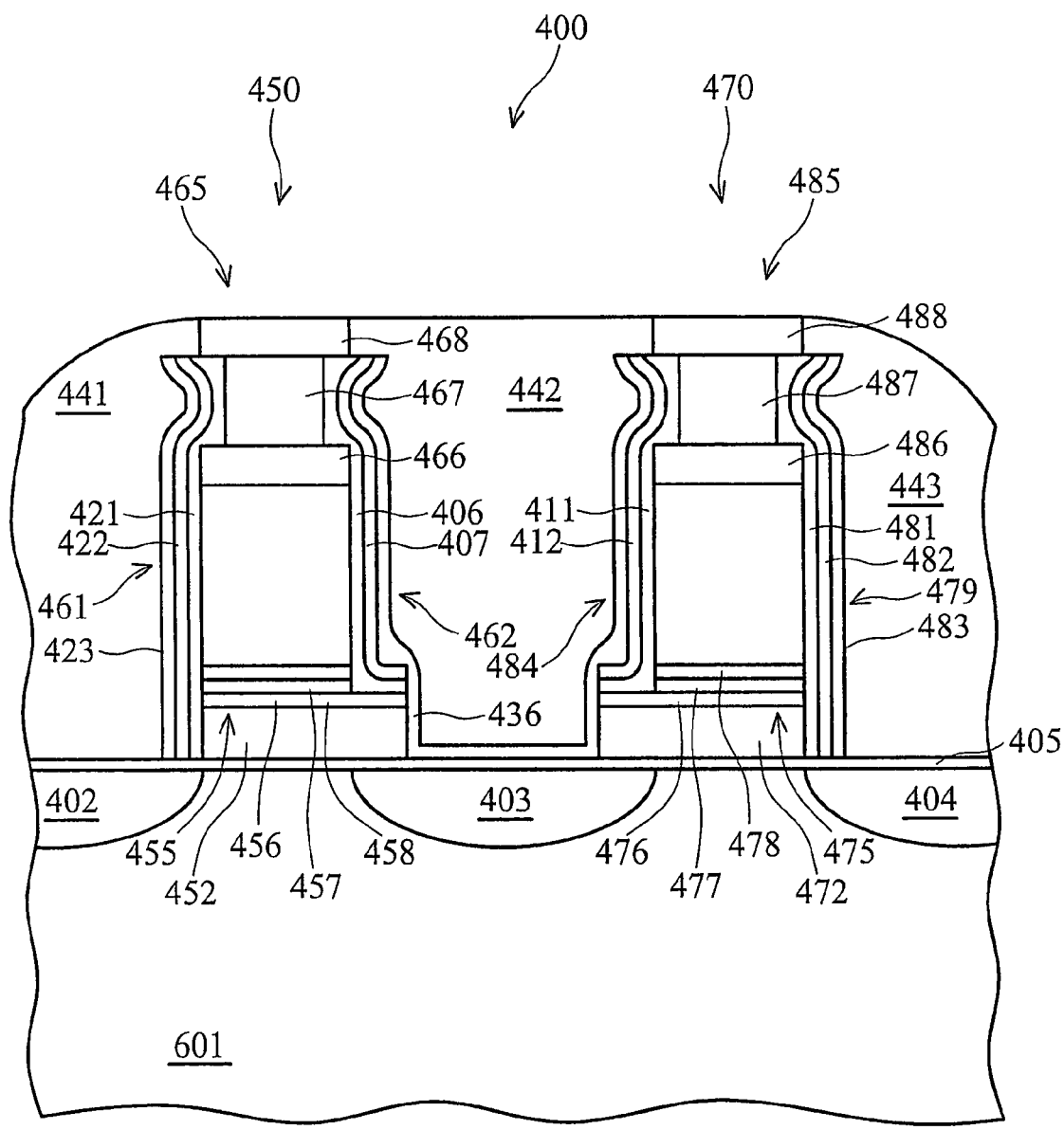
FIG. 4 is a side view of a illustrating in cross-section a semiconductor device according to an embodiment of the present invention.

FIG. 4 is a side view of a illustrating in cross-section a semiconductor device 400 according to an embodiment of the present invention. In the embodiment of FIG. 4, semiconductor device 400 includes a gate structure 450 and a gate structure 470 that are formed above a substrate 401. A drain region 402 is formed in the substrate 401 adjacent to, but on the exterior side of gate structure 450. Note that for convenience, the side of each respective gate structure facing the other will be referred to as the interior side; while the opposite side of each gate structure will correspondingly be referred to as the exterior. A second drain region 404 is similarly formed in the substrate 401 adjacent to and on the exterior side of gate structure 470. In this embodiment, a common source region is formed in substrate 401 adjacent to and between gate structures 450 and 470.

In this embodiment, a gate oxide layer 405 is formed on substrate 401. Note that a portion of gate oxide layer 405 also, in effect, forms part of gate structures 450 and 470; in an alternate embodiment (not shown) it may also be divided in to two separate gate oxide portions. Returning to the embodiment of FIG. 4, it is also noted that in this embodiment the two gate structures 450 and 470 form, from this view, mirror images of each other about an imaginary vertical plane between them. This is often though not necessarily always the case with this type of semiconductor device.

Each gate structure shown in FIG. 4 has a floating gate, numbered 452 and 472, formed immediately on top of the oxide layer 405. Floating gates 452 and 472 are typically made of, or at least include a poly material. Formed above floating gates 452 and 472 are, respectively, inter-gate dielectric layers 455 and 475. In the embodiment of FIG. 4, each of inter-gate dielectric layers 455 and 475 are actually made of three layers. Inter-gate dielectric 455 is formed of a lower layer 456, and middle layer 457, and an upper layer 458. Similarly, inter-gate dielectric 475 includes a lower layer 476, and middle layer 477, and an upper layer 478. In this embodiment, each of the inter-gate dielectric lower and upper layers are formed of an oxide, such as silicon dioxide and the middle layers are formed of a nitride such as silicon nitride. Other compositions are possible.

Above the inter-gate dielectric layers is formed control gate 460 and control gate 490, respectively. Control gates 460 and 490, like the floating gates 452 and 472 beneath them, are also formed of or at least include a poly material. Above each control gate is disposed a respective one of hard masks 465 and 485. In this embodiment, hard masks 465 and 485 each include three layers of material hard mask 465 includes a lower layer 466, a middle layer 467, and an upper layer 468. Likewise, hard mask 485 includes a lower layer 486, a middle layer 487, and an upper layer 488. In a preferred embodiment, the hard masks have a NON configuration, with the lower and upper layers of the hard masks formed of a nitride material, and the middle layers formed of an oxide. In the embodiment of FIG. 4, these oxide middle layers 467 and 487 have a reduced lateral dimension (side to side in this view) relative to the nitride layers below and above them.

The reduced lateral dimension of the middle, oxide layers 467 and 487 of hard masks 465 and 485, influences the formation of the gate dielectric spacers. In FIG. 4, gate dielectric spacers 461 and 462 are disposed on opposite sides of gate structure 450, spacer 461 being disposed on the exterior side and spacer 462 on the interior side. Correspondingly, gate dielectric spacer 484 is disposed in the interior side of gate structure 470 and spacer 479 is disposed on its exterior. As with the other layers of dielectric material illustrated here, the dielectric gate spacers are formed of a number of layers. The first exterior dielectric gate spacer 461 includes an inner layer 421, a middle layer 422, and an outer layer 423. The second exterior dielectric gate spacer 479 likewise includes an inner layer 481, a middle layer 482, and an outer layer 483. Similarly, the first interior dielectric spacer 462 has an inner layer 406, and a middle layer 407, while the second interior dielectric spacer 484 includes an inner layer 411 and a middle layer 412. An outer layer 436, in this embodiment, forms continuously the outer layer for first interior dielectric spacer 462 and second interior dielectric spacer 484. Each of the gate dielectric spacers, in this embodiment, is formed in an ONO configuration, with a nitride layer sandwiched in between two oxide layers. It is noted that, in this case, the oxide layer 436 may form a single layer where is adjoins oxide layer 405. This may not be true if, for example, the portion of oxide layer 405 disposed between gate structure 450 and gate structure 470 has been previously removed. Whether one or both oxide layers are present, the resulting oxide structure serves to separate the erase gate 442 from the substrate 401. In the embodiment of FIG. 4, however, only oxide layer 405 separates the wordline structures 441 and 443 from the substrate.

As should be apparent in FIG. 4, the respective gate dielectric spacers conform at least somewhat to the reduced lateral dimension of the hard mask oxide layers adjacent to them. During fabrication, the I-shaped configuration of the hard mask illustrated in FIG. 4 also induces the gate dielectric spacers to self-align to the appropriate height as they are being etched out of a dielectric layer that has been formed over the gate structures. This assists in the prevention of defects associated with gate dielectric spacers that are formed too high or too low.

Figure 5:
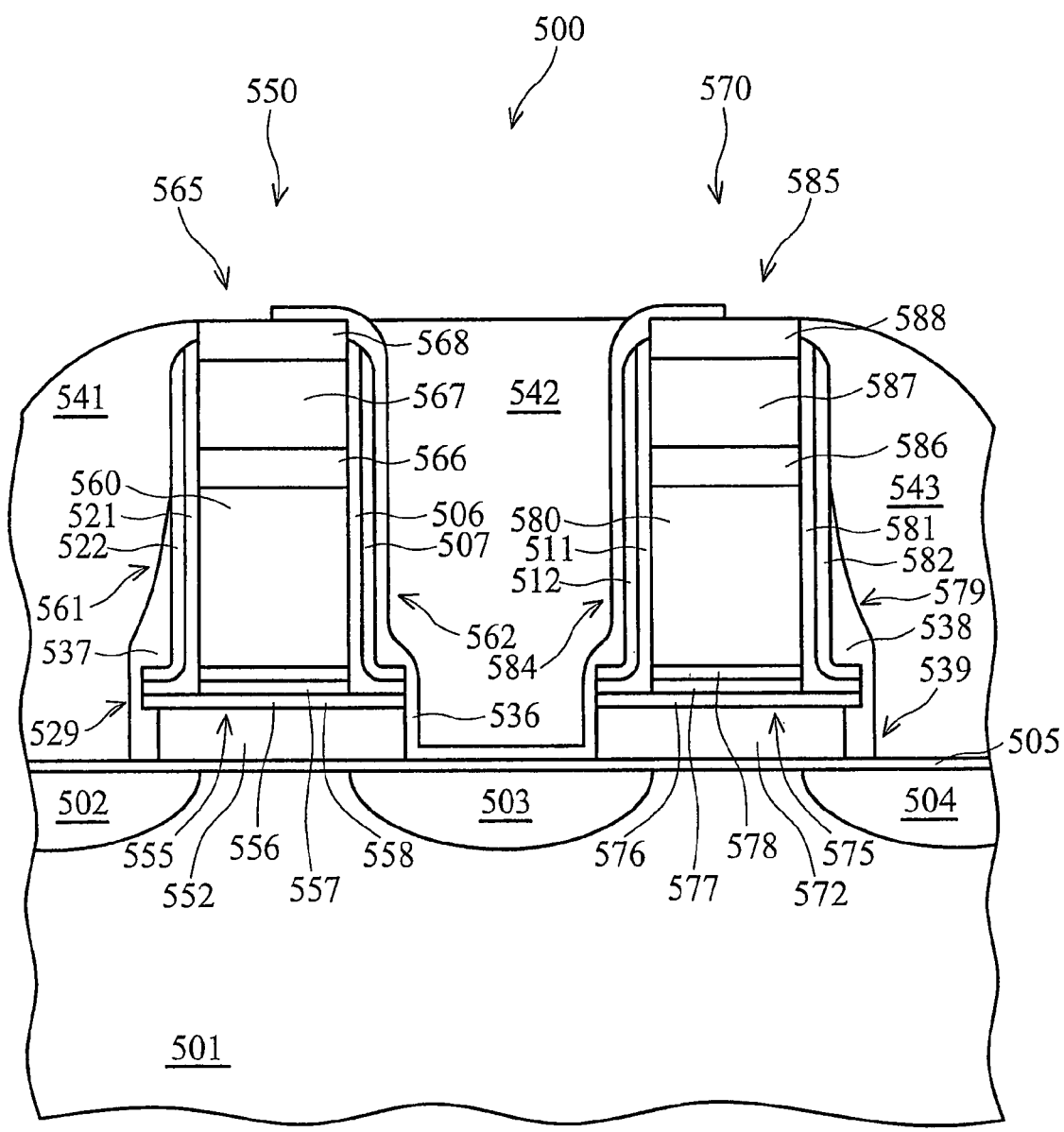
FIG. 5 is a side view of a illustrating in cross-section a semiconductor device according to an embodiment of the present invention.

FIG. 5 is a side view of a illustrating in cross-section a semiconductor device 500 according to an embodiment of the present invention. In the embodiment of FIG. 5, similar to the embodiment of FIG. 4 described above, semiconductor device 500 includes a gate structure 550 and a gate structure 570 that are formed above a substrate 501. A drain region 502 is formed in the substrate 501 adjacent to, but on the exterior side of gate structure 550. A second drain region 504 is similarly formed in the substrate 501 adjacent to and on the exterior side of gate structure 570. In this embodiment, a common source region 503 is formed in substrate 501 adjacent to and between gate structure 550 and 570.

In this embodiment, a gate oxide layer 505 is formed on substrate 501. Note that a portion of gate oxide layer 505 also, in effect, forms part of gate structure 550 and 570; in an alternate embodiment (not shown) it may also be divided in to two separate gate oxide portions. Returning to the embodiment of FIG. 5, it is also noted that in this embodiment the two gate structures 550 and 570 form, from this view, mirror images of each other about an imaginary vertical plane between them.

Each gate structure shown in FIG. 5 has a floating gate, numbered 552 and 572, formed immediately on top of the oxide layer 505. Floating gates 552 and 572 are again preferably made of or at least include a poly material. Formed above floating gates 552 and 572 are, respectively, inter-gate dielectric layers 555 and 575. In the embodiment of FIG. 5, each of inter-gate dielectric layers 555 and 575 are made of three layers. Inter-gate dielectric 555 is formed of a lower layer 556, and middle layer 557, and an upper layer 558. Similarly, inter-gate dielectric 575 includes a lower layer 576, and middle layer 577, and an upper layer 578. In this embodiment, each of the inter-gate dielectric lower and upper layers are also formed of an oxide, such as silicon oxide and the middle layers are formed of a nitride such as silicon nitride.

Above the inter-gate dielectric layers 555 and 575 is formed control gate 560 and control gate 590, respectively.

Control gates 560 and 590, like the floating gates 552 and 572 beneath them, are also formed of or at least include a poly material. Above each control gate is disposed a respective one of hard masks 565 and 585. In this embodiment, hard masks 565 and 585 each include three layers of material hard mask 565 includes a lower layer 566, a middle layer 567, and an upper layer 568. Likewise, hard mask 585 includes a lower layer 586, a middle layer 587, and an upper layer 588. In a preferred embodiment, the lower and upper layers of the hard masks are formed of a nitride material, while the respective middle layers are formed of an oxide.

In the embodiment of FIG. 5, gate dielectric spacers 561 and 562 are disposed on opposite sides of gate structure 550, spacer 561 being disposed on the exterior side and spacer 562 on the interior side. Correspondingly, gate dielectric spacer 584 is disposed in the interior side of gate structure 570 and spacer 579 is disposed on its exterior. As with the other layers of dielectric material illustrated here, the dielectric gate spacers are formed of a number of layers. Each of the gate dielectric spacers, in this embodiment, is also preferably formed in an ONO configuration, with a nitride layer sandwiched in between two oxide layers.

The first interior dielectric spacer 562 has an inner layer 506, and a middle layer 507, while the second interior dielectric spacer 584 includes an inner layer 511 and a middle layer 512. An outer layer 536, in this embodiment, forms continuously the outer layer for first interior dielectric spacer 562 and second interior dielectric spacer 584. The first exterior dielectric gate spacer 561 includes an inner layer 521 and a middle layer 522. Outer layer 537, in this embodiment has been formed to provide a region of uniform thickness 529 on the exterior side of floating gate 552. The second exterior dielectric gate spacer 579 likewise includes an inner layer 581 and a middle layer 582, and outer layer 538 has been formed to provide a region of uniform thickness 539 on the exterior side of floating gate 572. This region of uniform thickness results from fabricating semiconductor device 500 according to an embodiment of the present invention and has been found, for example, to reduce the risk of RTV (reverse tunneling voltage) failure for the device.

As with the semiconductor device 400 shown in FIG. 4, in semiconductor device 500 the oxide layer 505 and outer layer 536 (to the extent they are considered separate layers) separate the erase gate 542 from the substrate 501. Also as with the embodiment of FIG. 4, in semiconductor device 500 the oxide layer 505 separates the wordline structures 541 and 543 from the substrate.

Figure 6:
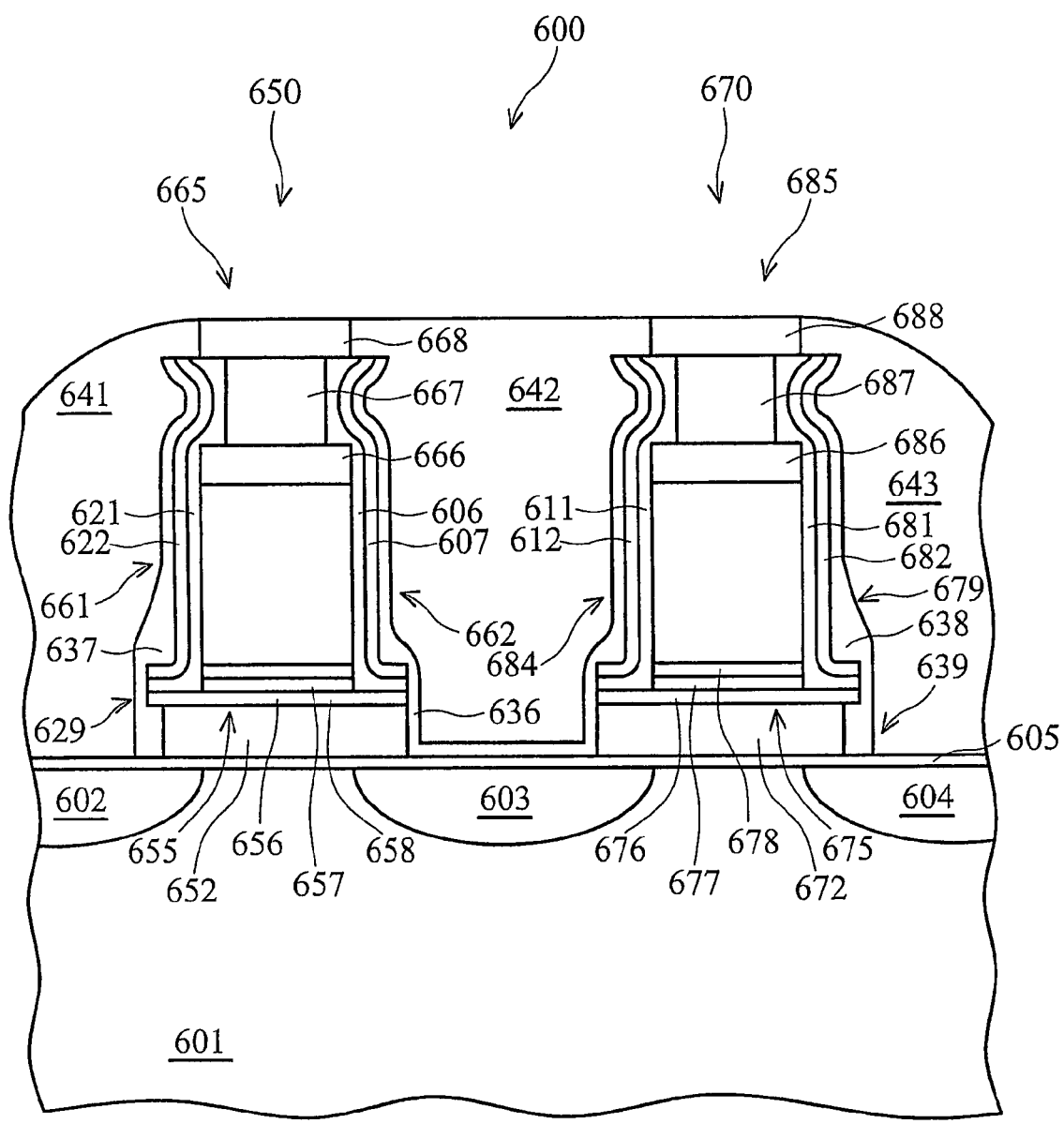
FIG. 6 is a side view of a illustrating in cross-section a semiconductor device according to an embodiment of the present invention.

FIG. 6 is a side view of a illustrating in cross-section a semiconductor device 600 according to an embodiment of the present invention. In the embodiment of FIG. 6, similar to the embodiments of FIGS. 4 and 5 described above, semiconductor device 600 includes a gate structure 650 and a gate structure 670 are formed above a substrate 601. A drain region 602 is formed in the substrate 601 adjacent to, but on the exterior side of gate structure 650. A second drain region 604 is similarly formed in the substrate 601 adjacent to and on the exterior side of gate structure 670. In this embodiment, a common source region is formed in substrate 601 adjacent to and between gate structure 650 and 670. A gate oxide layer 605 is formed on substrate 601, and in effect forms part of gate structure 650 and 670.

The gate structures shown in FIG. 6 each have a floating gate, numbered 652 and 672, formed immediately on top of the oxide layer 605. Floating gates 652 and 672 are again preferably made of or at least include a poly material. Formed above floating gates 652 and 672 are, respectively, inter-gate dielectric layers 655 and 675. In the embodiment of FIG. 6, each of inter-gate dielectric layers 655 and 675 are again made of three layers. Inter-gate dielectric 655 is formed of a lower layer 656, and middle layer 657, and an upper layer 658. Similarly, inter-gate dielectric 675 includes a lower layer 676, and middle layer 677, and an upper layer 678. In this embodiment, each of the inter-gate dielectrics are again formed in and ONO (oxide, nitride, oxide) configuration.

Above the inter-gate dielectric layers is formed control gate 660 and control gate 690, respectively. Control gates 660 and 690, like the floating gates 652 and 672 beneath them, are also formed of or at least include a poly material. Above each control gate is disposed a respective one of hard masks 665 and 685. In this embodiment, hard masks 665 and 685 each include three layers of material hard mask 665 includes a lower layer 666, a middle layer 667, and an upper layer 668. Likewise, hard mask 685 includes a lower layer 686, a middle layer 687, and an upper layer 688. In this embodiment, the respective lower and upper layers of the hard masks are formed of a nitride material, while the middle layers are formed of an oxide. As with the embodiment of FIG. 4, in the embodiment of FIG. 6 the oxide layers 667 and 687 have an I-shaped profile, that it, a reduced lateral dimension relative to the nitride layers below and above them. In an alternate embodiment (not shown), the middle layer and the lower layer, if present, both have a reduced dimension with respect to the top hard mask layer.

As with semiconductor device 400 of FIG. 4, the reduced lateral dimension of the middle, oxide layers 667 and 687 of hard masks 665 and 685 influence the formation of the gate dielectric spacers, and widen the etching process window. Referring to FIG. 6, gate dielectric spacers 661 and 662 are disposed on opposite sides of gate structure 650, spacer 661 being disposed on the exterior side and spacer 662 on the interior side. Correspondingly, gate dielectric spacer 684 is disposed in the interior side of gate structure 670 and spacer 679 is disposed on its exterior. As with the other layers of dielectric material illustrated here, the dielectric gate spacers are formed of a number of layers, a configuration preferred but not required. In the embodiment of FIG. 6, the first exterior dielectric gate spacer 661 includes an inner layer 621, a middle layer 622, and an outer layer 623. The second exterior dielectric gate spacer 679 likewise includes an inner layer 681, a middle layer 682, and an outer layer 683. Similarly, the first interior dielectric spacer 662 has an inner layer 606, and a middle layer 607, while the second interior dielectric spacer 684 includes an inner layer 611 and a middle layer 612.

An outer layer 636, in this embodiment, forms continuously the outer layer for first interior dielectric spacer 662 and second interior dielectric spacer 684. Each of the gate dielectric spacers, in this embodiment, is formed in an ONO configuration, with a nitride layer sandwiched in between two oxide layers. Portions of outer layer 636 and oxide layer 605 separate the erase gate 642 from the substrate 601. Oxide layer 605 separates the wordline structures 641 and 643 from the substrate. Note that the embodiment of FIG. 6 substantially combines the advantageous improvements of both the embodiments of FIG. 4 and FIG. 5 in order to obtain the benefits thereof.

Figure 7:
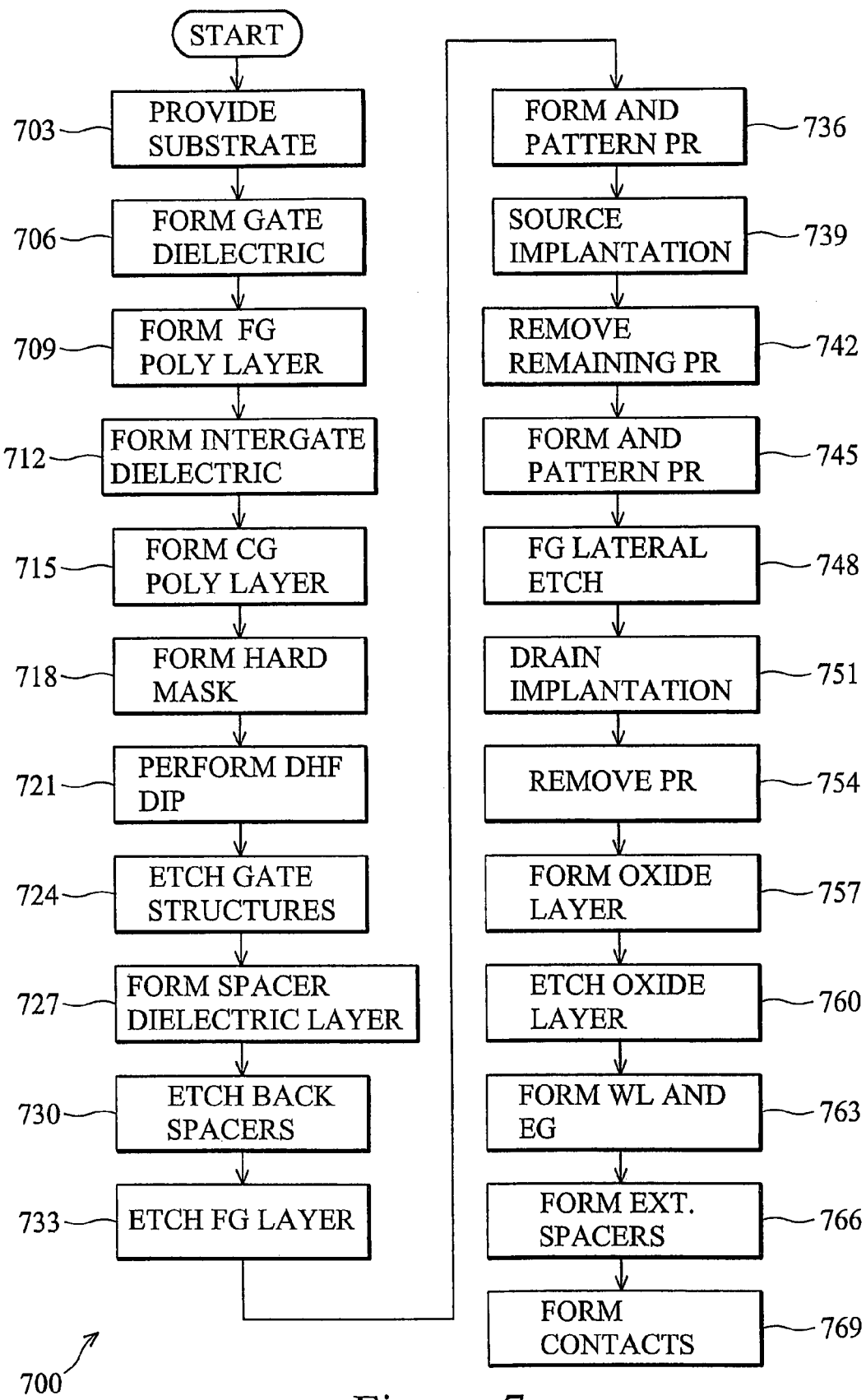
FIG. 7 is a flow diagram illustrating a method of fabricating a semiconductor device according to an embodiment of the present invention.

FIG. 7 is a flow diagram illustrating a method 700 of fabricating a semiconductor device according to an embodiment of the present invention. At START, it is presumed that all materials and equipment necessary to performance of the method 700 are available and operational. According to this embodiment, the method 700 then begins with providing a substrate (step 703), and forming a gate dielectric layer (step 706), usually an oxide, on the substrate. A poly layer for the floating gates, that is the layer out of which one or more floating gates will be created, may then be formed (step 709). This is followed by an inter-gate dielectric layer (step 712). In this embodiment, the inter-gate dielectric layer includes an oxide layer, a nitride layer, and another oxide layer, deposited one at a time (though not separately shown in FIG. 7). A poly layer for the control gates is then formed (step 715).

In the embodiment of FIG. 7, a hard mask is then formed (step 718) in three separately deposited layers; a nitride layer, and oxide layer, and another nitride layer, followed by a selective etching to create the hard mask structures (steps not separately shown). Note that this in describing this embodiment, it will be assumed that two gate structures are being formed. The method 700 is, however, applicable, perhaps with minor modifications, to forming one gate structure, or more than two as well. A DHF dip is then performed (step 721) to produce an I-shaped hard mask that is one where the middle oxide layer has a reduced lateral dimension as compared to the nitride layers above and below it. The hard masks are then used to create the gate structures through an etching process (step 724). In this embodiment, the gate-structure etching is allowed to continue until all gate features have been formed, excluding the floating gates and the gate dielectrics. A spacer dielectric layer is then formed (step 727), again in three layers, an oxide layer on the inside, followed by a nitride layer, and by an outside layer of oxide (steps not separately shown). A spacer etch back (step 730) may be used to divide the spacer dielectric layer into separate spacer structures.

In this embodiment, a poly-etching process step may then be performed (step 733) to form the floating gate and gate dielectric portions of the respective gate structures. The substrate is at this point exposed except where it is covered by the gate structures themselves. The sides of each floating gates are substantially aligned with the outside of the gate spacer dielectric layers. A photoresist layer is then formed and patterned (step 736) so as to protect the area outside of the newly formed gate structures. Ion implantation (step 739) may then be used to create the common source area in the substrate. This photoresist layer may then be removed (step 742). A photoresist layer protecting the interior sides of the respective gates may then be formed and patterned (step 745). With this protection in place, a floating-gate lateral etching is performed (step 748) such that the exterior side of each floating gate is etched back to a position under the adjacent gate dielectric spacer. The extent of the undercut created will vary from application to application.

In this embodiment, once the oxide layer has been formed and etched to produce the desired external gate dielectric layer configuration, an implantation can be performed (step 751) to form the drain regions adjacent to the exterior sides of the gate structures. The remaining photoresist is then removed (step 754), for example using an ashing process. An oxide layer is then formed (step 757) over the gate structures and etched (step 760) to the desired thickness. The wordline structures and erase gate may then be formed (step 763). This is typically done in a number of steps (not shown separately) including, for example, forming a poly layer and then etching it back to the appropriate level. Exterior spacers may then be added (step 766).

At this point, electrical contacts may then be added (step 769) to any areas in which they are required. In a preferred embodiment, for example, a layer of metal or some other suitable material would be added to the erase gate, drains, and wordline structures. The process could then continue with the next fabrication or finishing steps to prepare the wafer on which the devices are being fabricated for singulation.

The process described above results in a flash cell structure substantially similar to the one illustrated in FIG. 6. Other methods are possible, of course, including those that do not include both the I-shaped hard mask structure and the oxide layer of uniform thickness exterior to the floating gates. Moreover, the steps of the method may be performed in any logically permissible order.

Figure 8A:
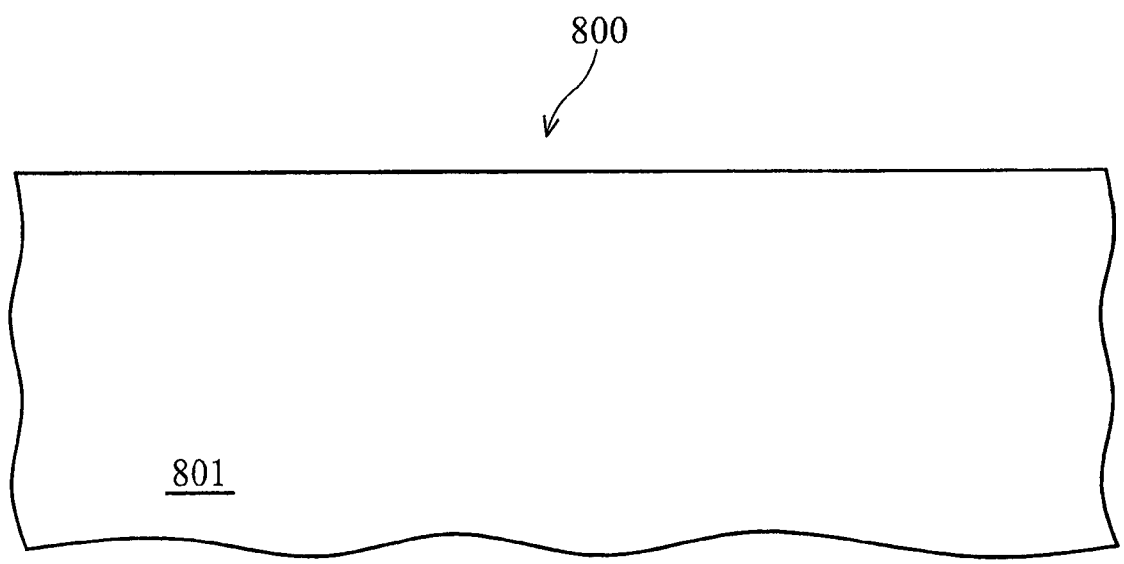
FIGS. 8a through 8j are a sequence of side views illustrating in cross-section the configuration of semiconductor device at various stages during fabrication according to an embodiment of the present invention.

FIGS. 8a through 8j are a sequence of side views illustrating in cross-section the configuration of semiconductor device 800 at various stages during fabrication according to an embodiment of the present invention. FIG. 8a simply illustrates the wafer substrate 801 upon which semiconductor device 800 is to be constructed. As should be apparent, shown in FIG. 8a is only a very small portion of the entire substrate 801, and semiconductor device 800 is only one of thousands of such devices that are typically fabricated at the same time. Of course other types of devices may be present as well, and if so they may be partially or completely fabricated simultaneously with semiconductor device 800.

Figure 8B:
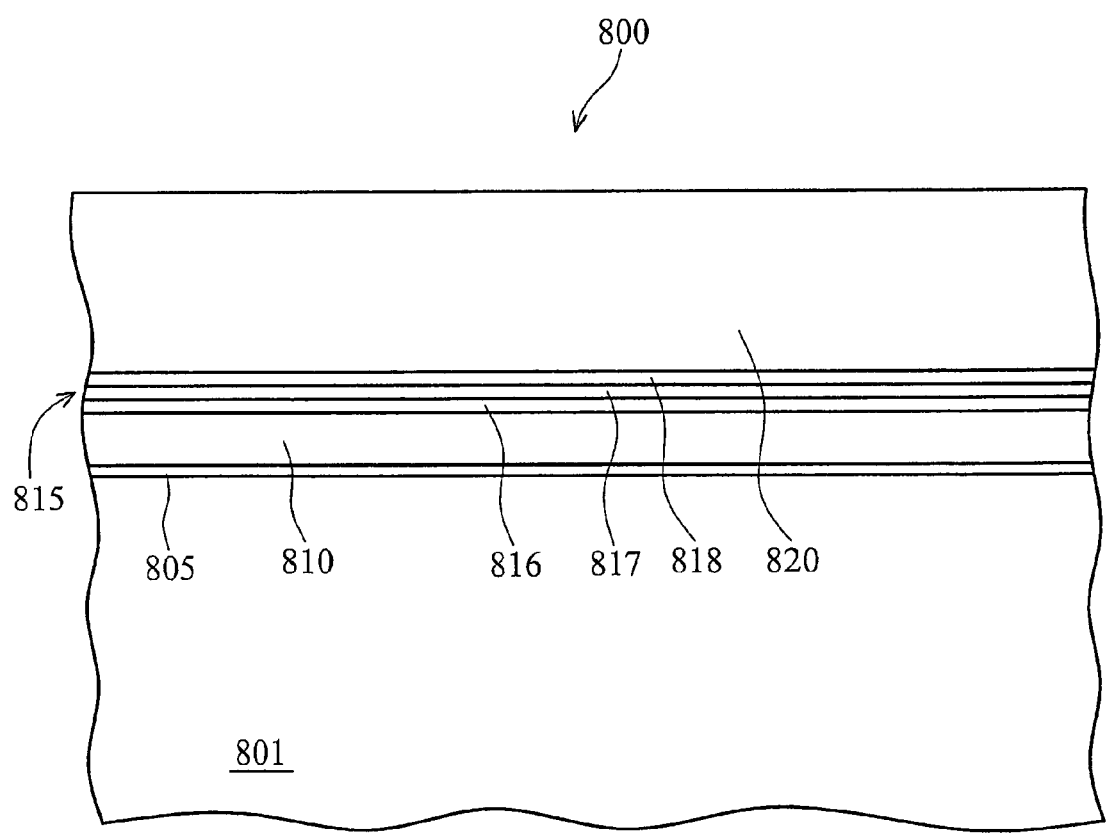
Figure 8C:
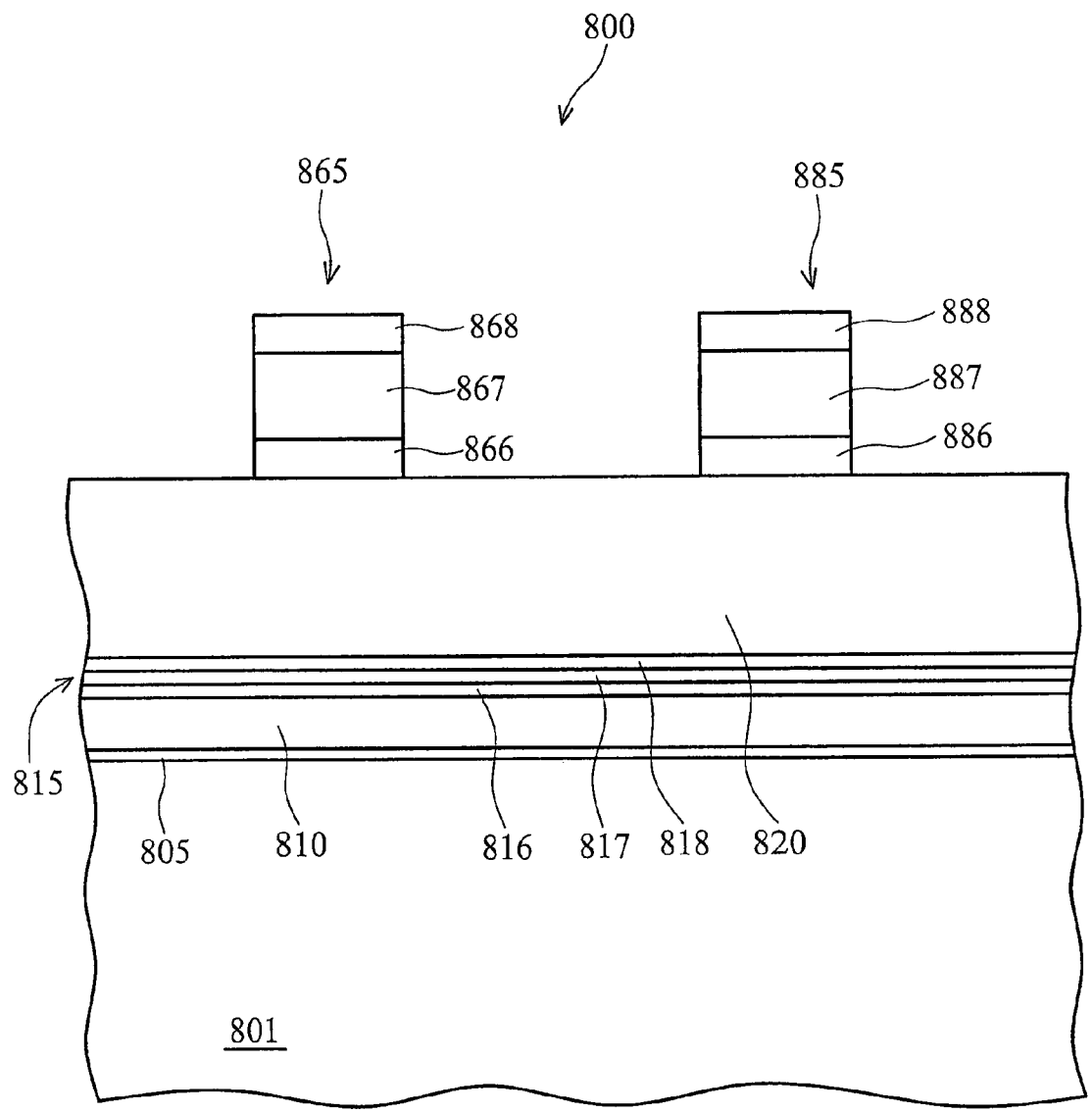

In this embodiment, as shown in FIG. 8b, an oxide layer 805 is then formed over the substrate 801, and a poly layer 810, which will be used to form the flash cell floating gates, is formed over the oxide layer 805. The floating gate (FG) poly layer 810 may be, for example, approximately 400 Å in thickness. An inter-gate dielectric layer 815 is then added over the FG poly layer 810. In this embodiment, dielectric layer 815 includes an oxide layer 816, a nitride layer 817 formed on oxide layer 816, and an oxide layer 818 formed on nitride layer 817. Above dielectric layer 815 is formed a poly layer 820 that will be used to form the flash cell control gates, and may be about 800 Å thick.

In forming the gate structures, a hard mask will be used. In the embodiment of FIGS. 8a through 8j, a hard mark layer includes three individually formed layers. A nitride layer is formed directly on the control-gate poly layer 820, an oxide layer is then formed on the nitride layer, and finally on upper nitride layer is formed on the oxide layer. To form the hard mask structures used in this embodiment for defining the flash cell gate structures, a photoresist layer is formed on the hard mask layer and patterned. After an etching step, the remaining photoresist is removed, resulting in the structure shown in FIG. 8c, where hard masks 865 and 870 are shown above control-gate poly layer 820.

Figure 8D:
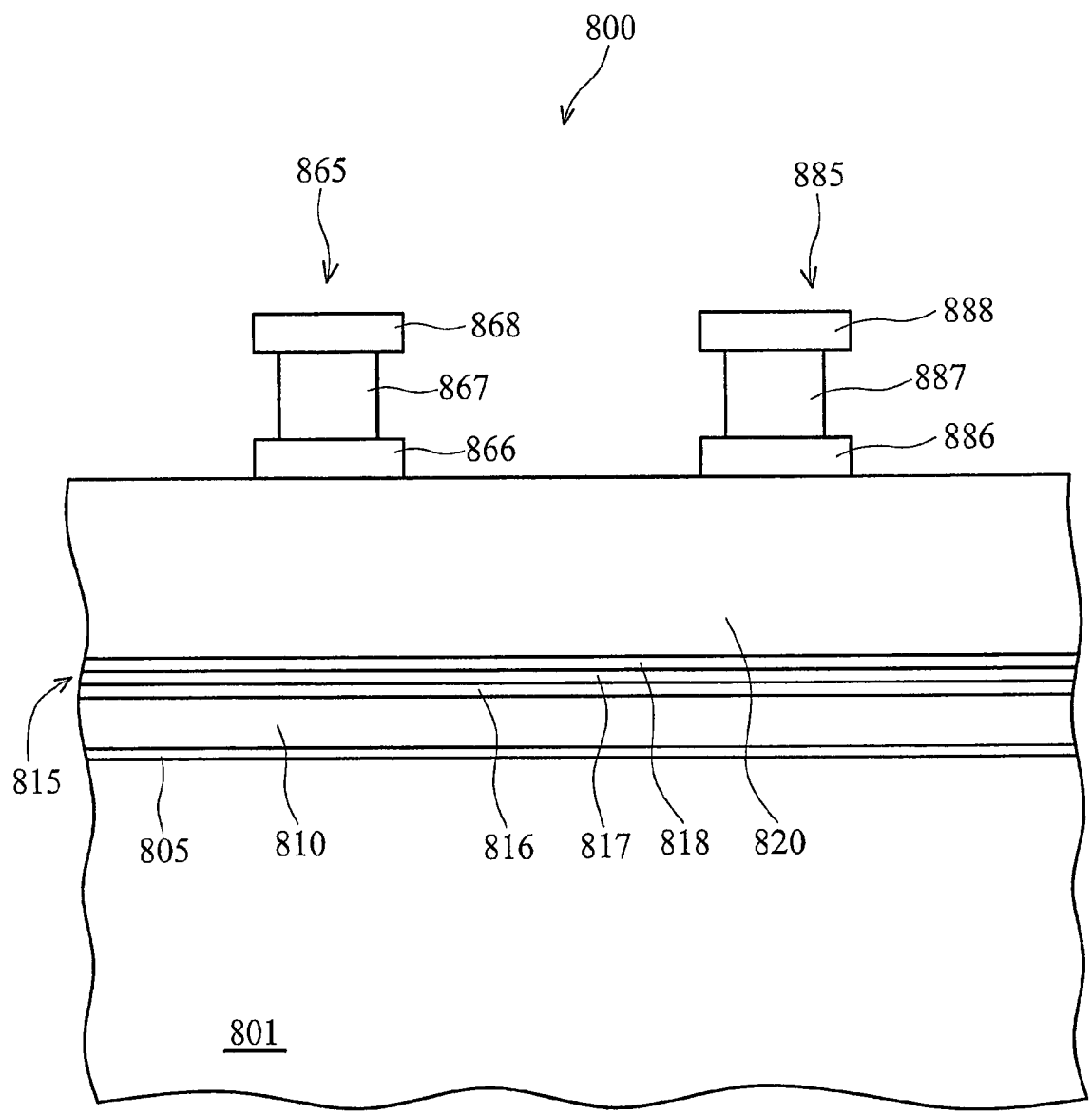
Figure 8E:
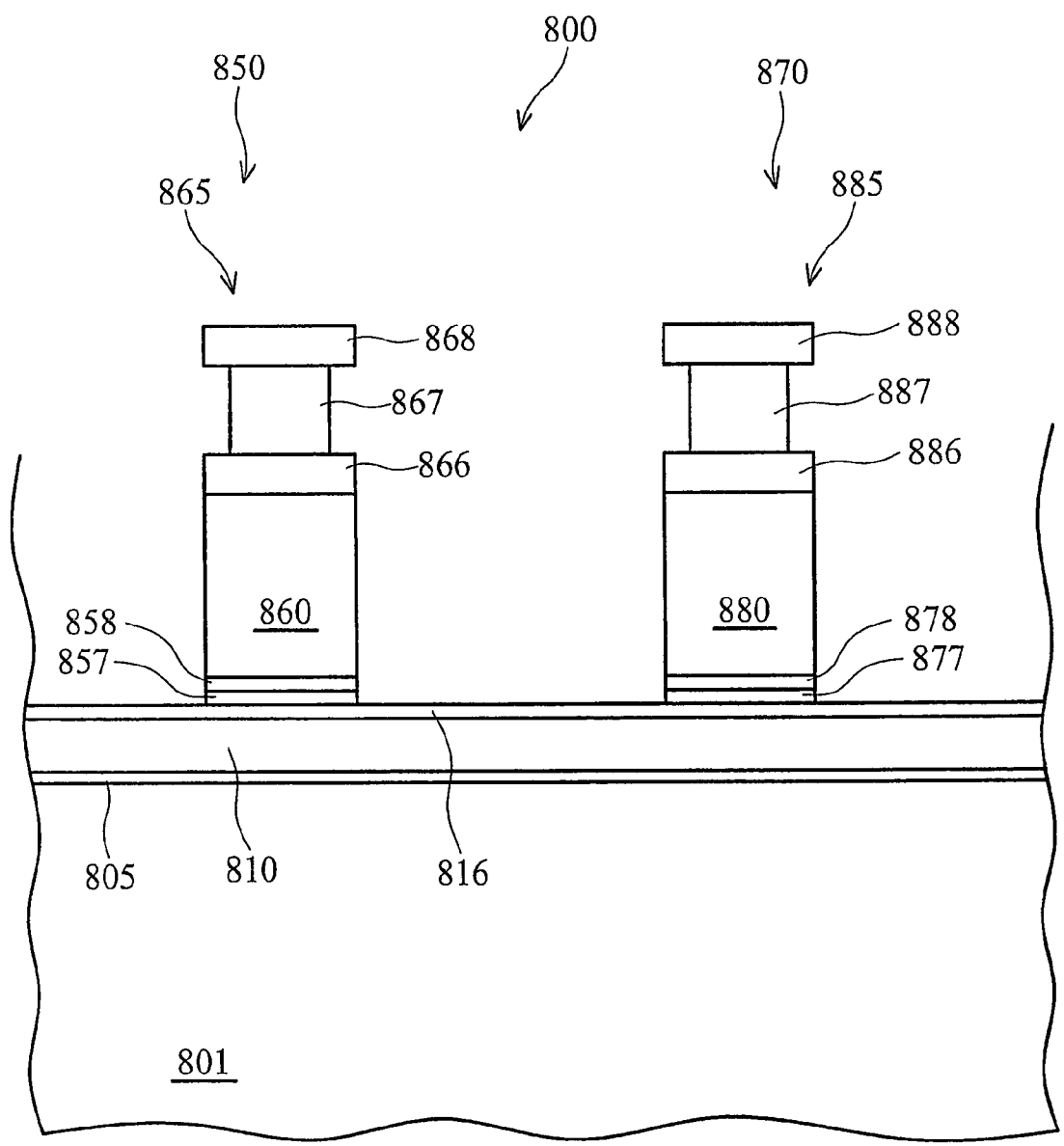

In accordance with this embodiment of the present invention, a DHF (dilute hydrofluoric acid) dip is then performed to laterally etch hard mask oxide layers 867 and 887 of each hard mask, creating the approximately I-shaped hard mask structures 865 and 885, as shown in FIG. 8d. A poly etch is then performed to expose the sides of the control gates, removing the control gate poly layer 820 except where it is disposed within the intended gate structures themselves. Also removed are oxide layer 818 and nitride layer 817 of dielectric layer 820. The resulting configuration is shown in FIG. 8e.

Figure 8F:
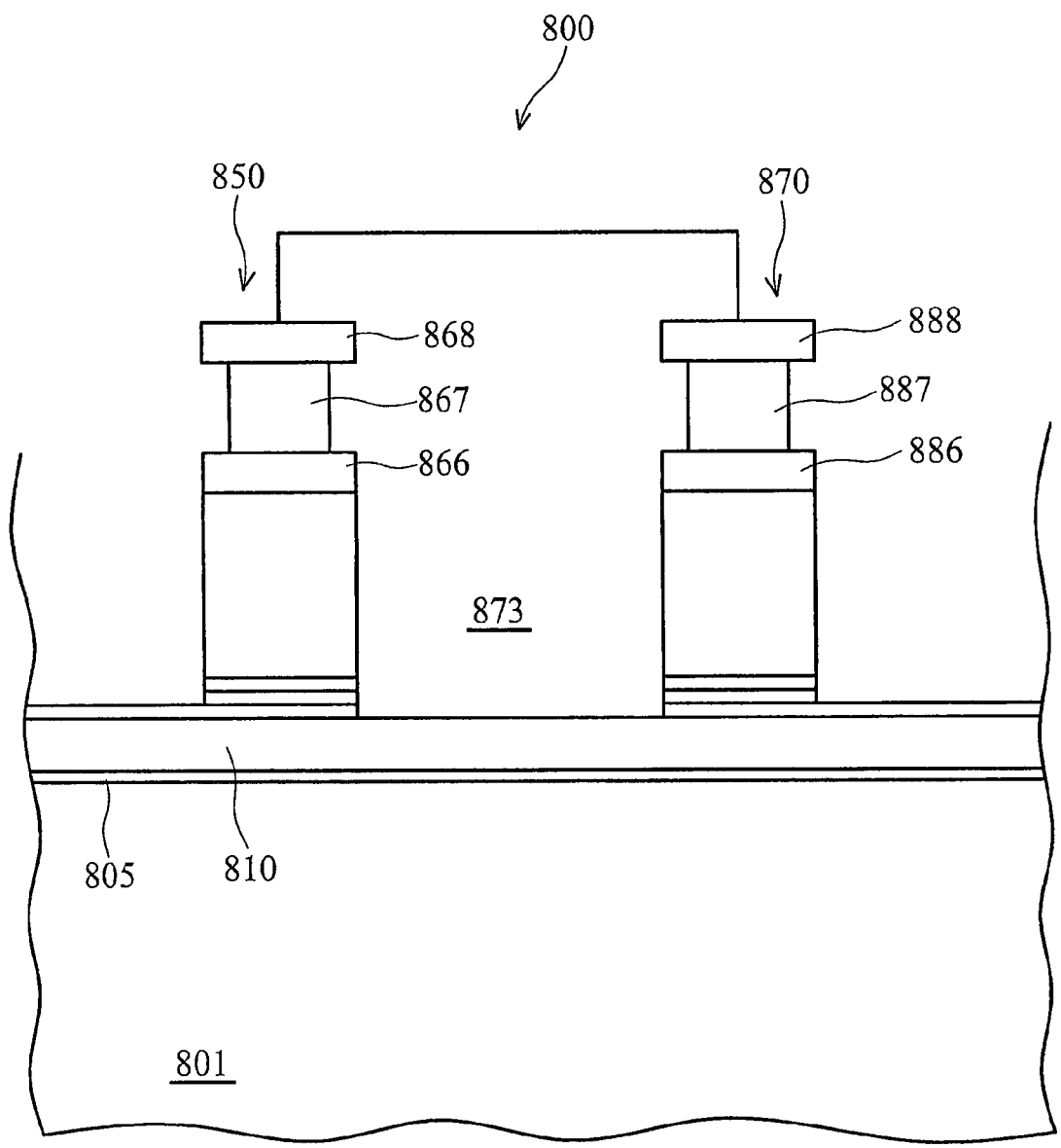
Figure 8G:
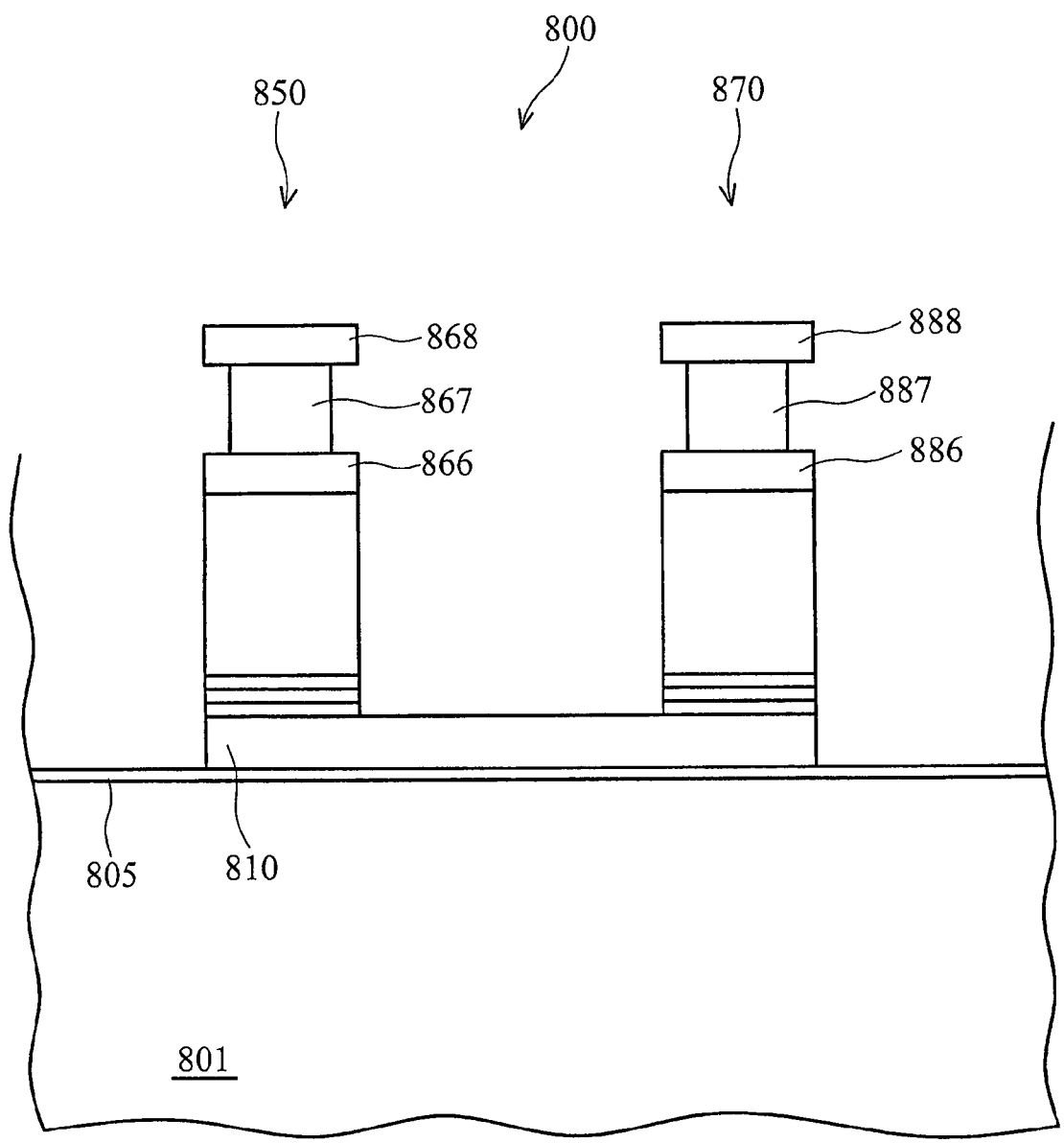

A patterned photo resist layer 873 is then formed, covering the area between the gate structures of the flash cell, as shown in FIG. 8f. A wordline poly etching is then performed, exposing the sides of the floating gate portion of each structure that will face the wordline structures disposed on the outside. The remaining photoresist is then removed, leaving the configuration shown in FIG. 8g.

Figure 8H:
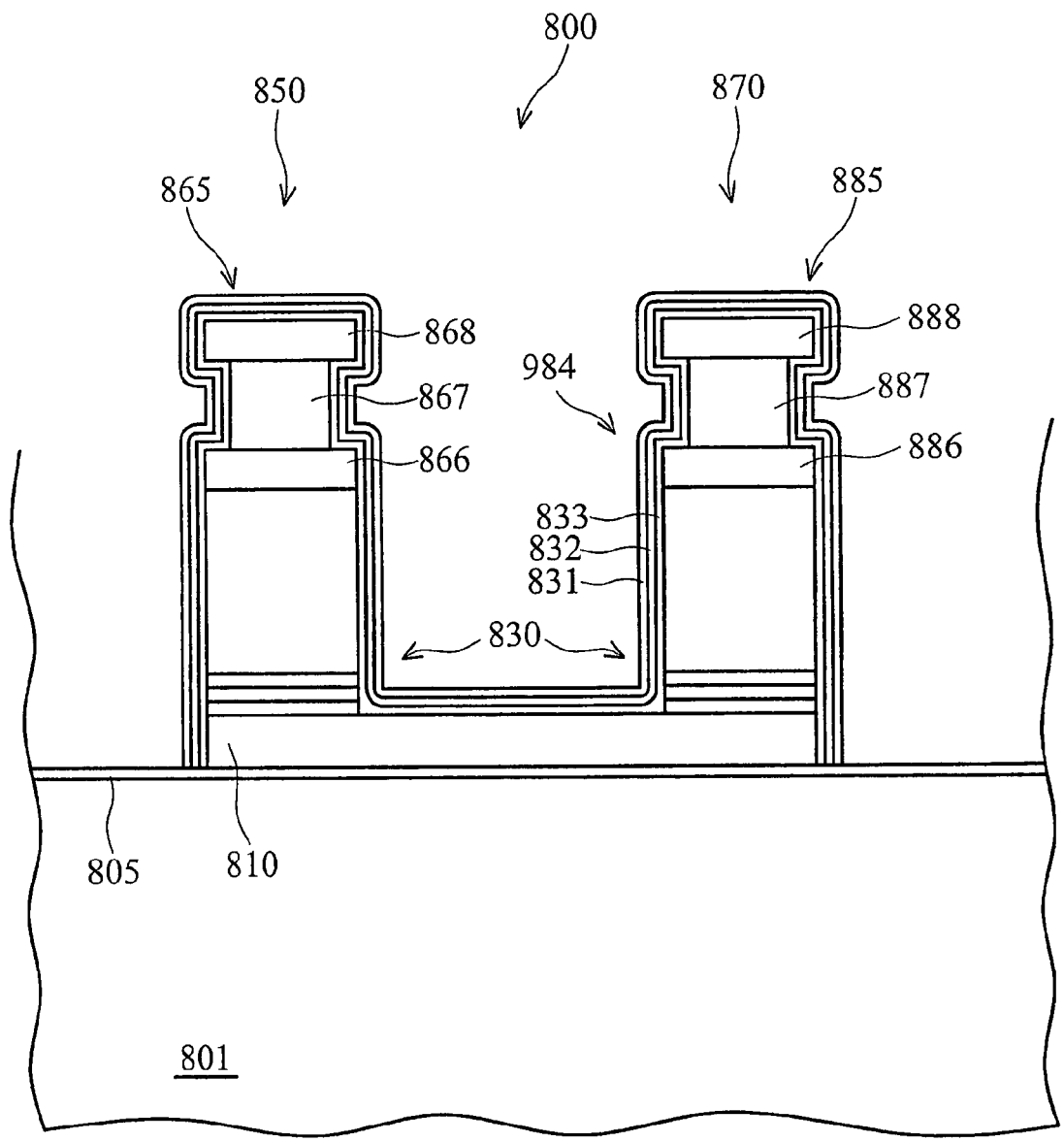
Figure 8I:
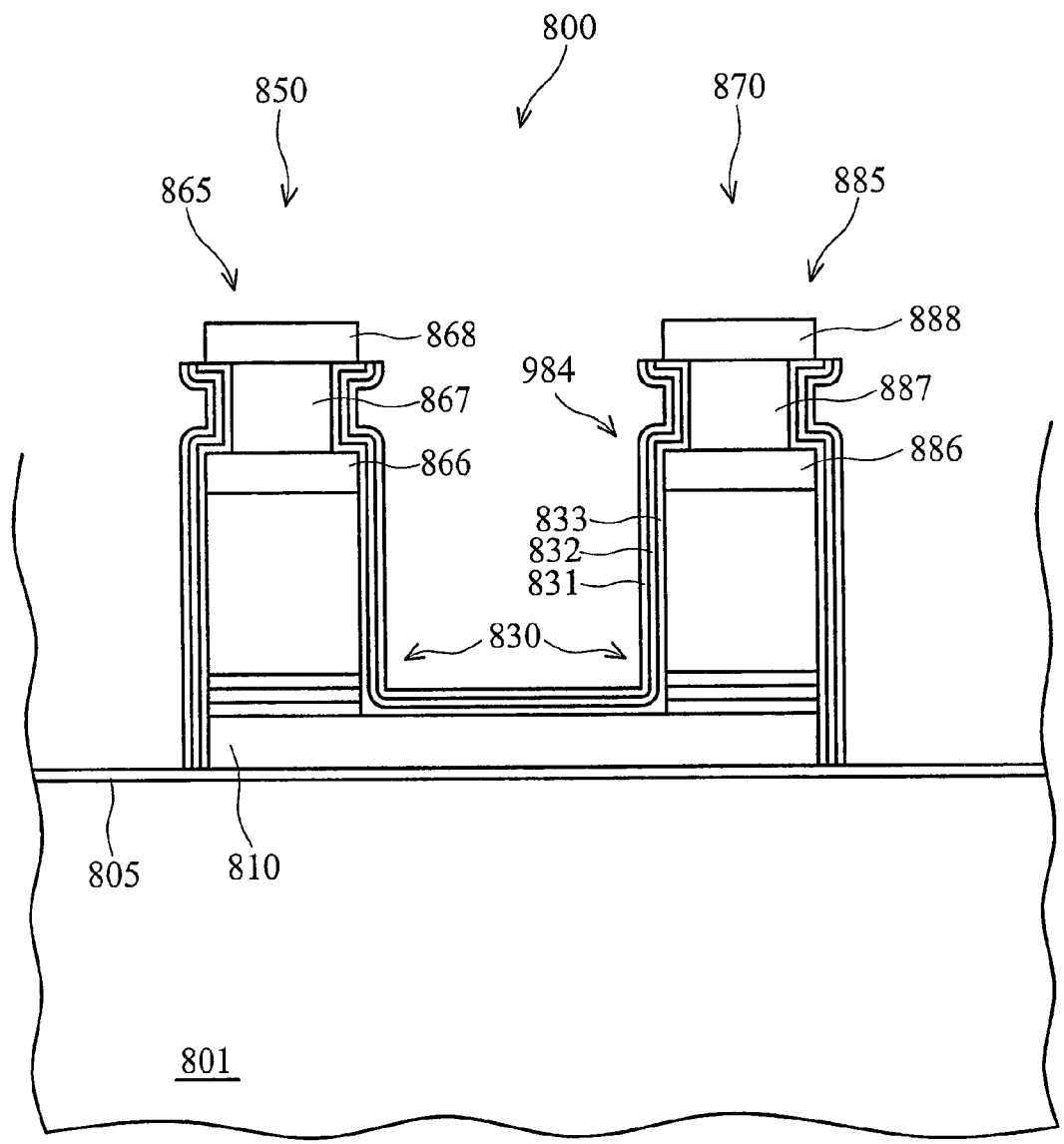
Figure 8J:
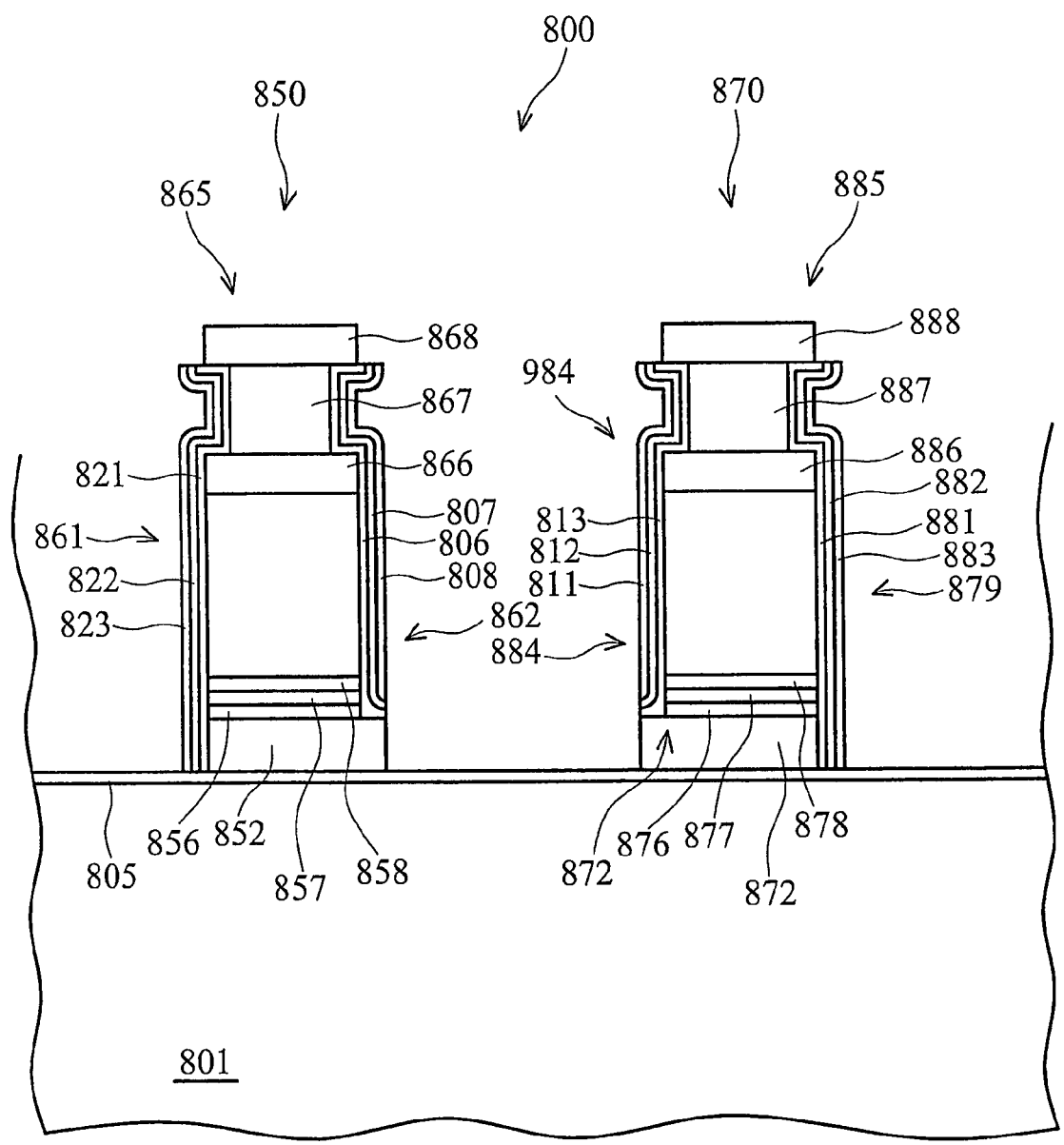

According to this embodiment of the present invention, a spacer dielectric layer 830 is then formed. As shown in FIG. 8h, spacer dielectric layer 830 includes in the embodiment of an oxide layer 831, a nitride layer 832, and an oxide layer 833, formed in that order. It should also be apparent that spacer dielectric 830 conforms to the I-shaped profile of the hard masks 865 and 885. This is significant, as the spacer dielectric then tends to self-align to the top of hard mask oxide layers 867 and 887 when spacer etching is performed. The configuration of semiconductor device 800 following this etching step is illustrated in FIG. 8i.

In this embodiment, a photoresist layer (not shown) is formed and patterned, protecting the respective exterior sides of gate structures 850 and 870, so that the floating gate poly layer 810 may be selectively etched away, exposing the interior-facing sides of the floating gates 852 and 872. The remaining photoresist is then etched away, leaving the configuration shown in FIG. 8j. Note that for purposes of clarity, the separated portions of the various layers are now referred to as separate structures. For example one portion of spacer dielectric layer 830 is now referred to as first exterior gate spacer 861, including inner oxide layer 821, nitride layer 822, and outer oxide layer 823. Likewise, second exterior gate spacer 879 is formed of layers 881, 882, and 883. On the respective interior sides of gate structures 850 and 870 are first interior gate spacer 862 formed of layers 806, 807, and 808, and second interior gate spacer 884 formed of layers 811, 812, and 813. Note, however, that as fabrication continues in this embodiment, an interior oxide layer (not shown) is added prior to the formation of the erase gate and wordline structures (also not shown).

Figure 1:
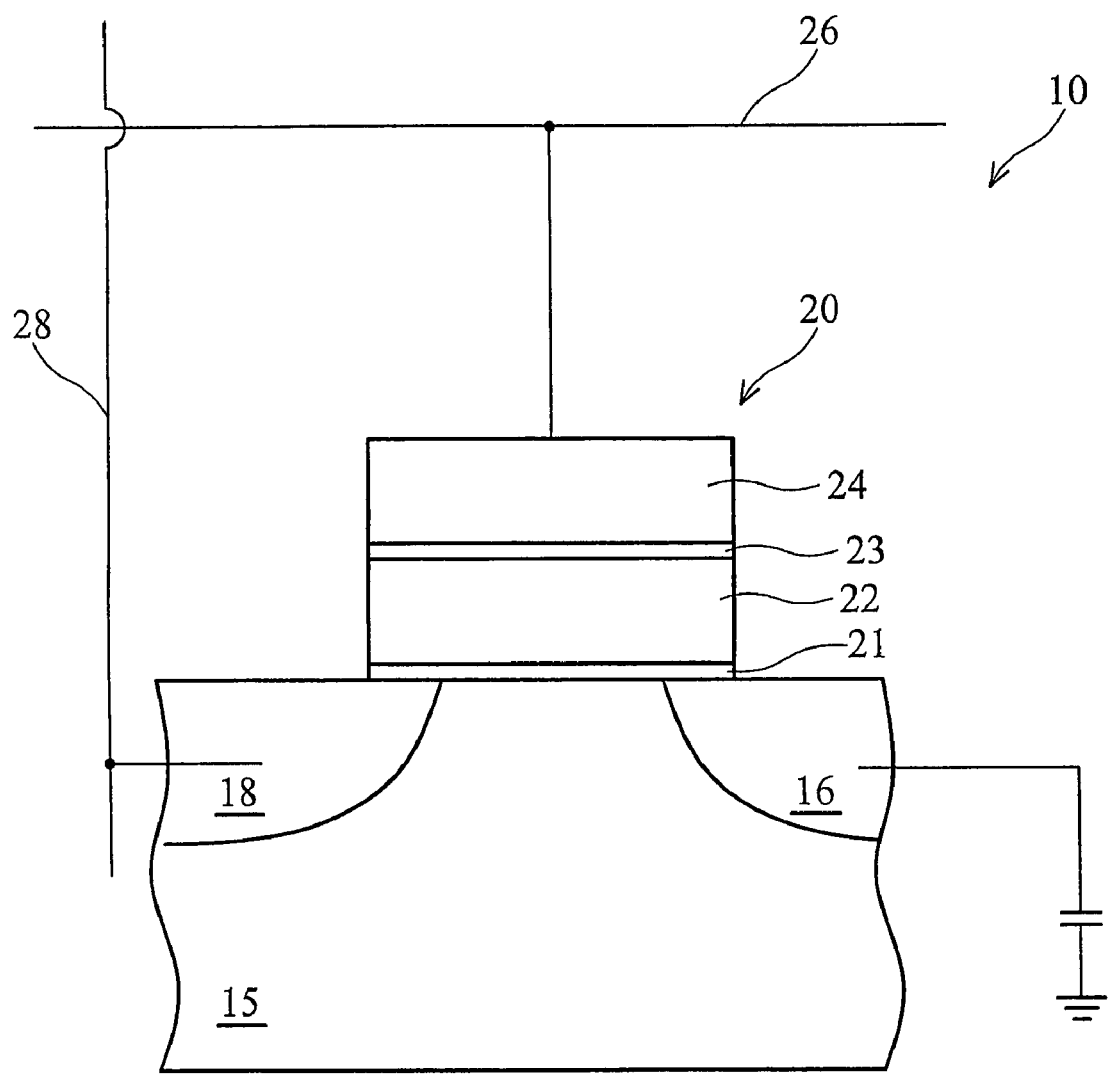
FIG. 1 is a simplified schematic diagram illustrating an exemplary flash cell.
Figure 2:
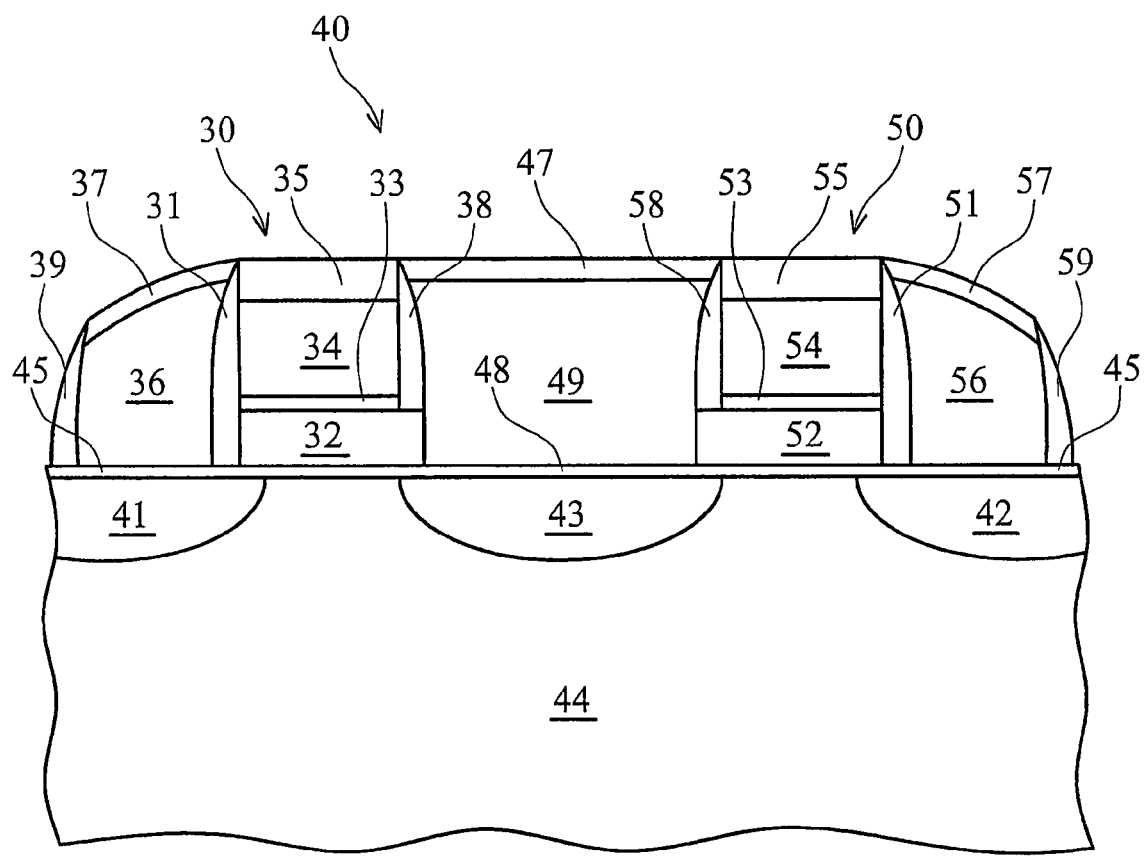
FIG. 2 is a side view of a flash cell, illustrating this exemplary semiconductor device in cross-section.
Figure 3:
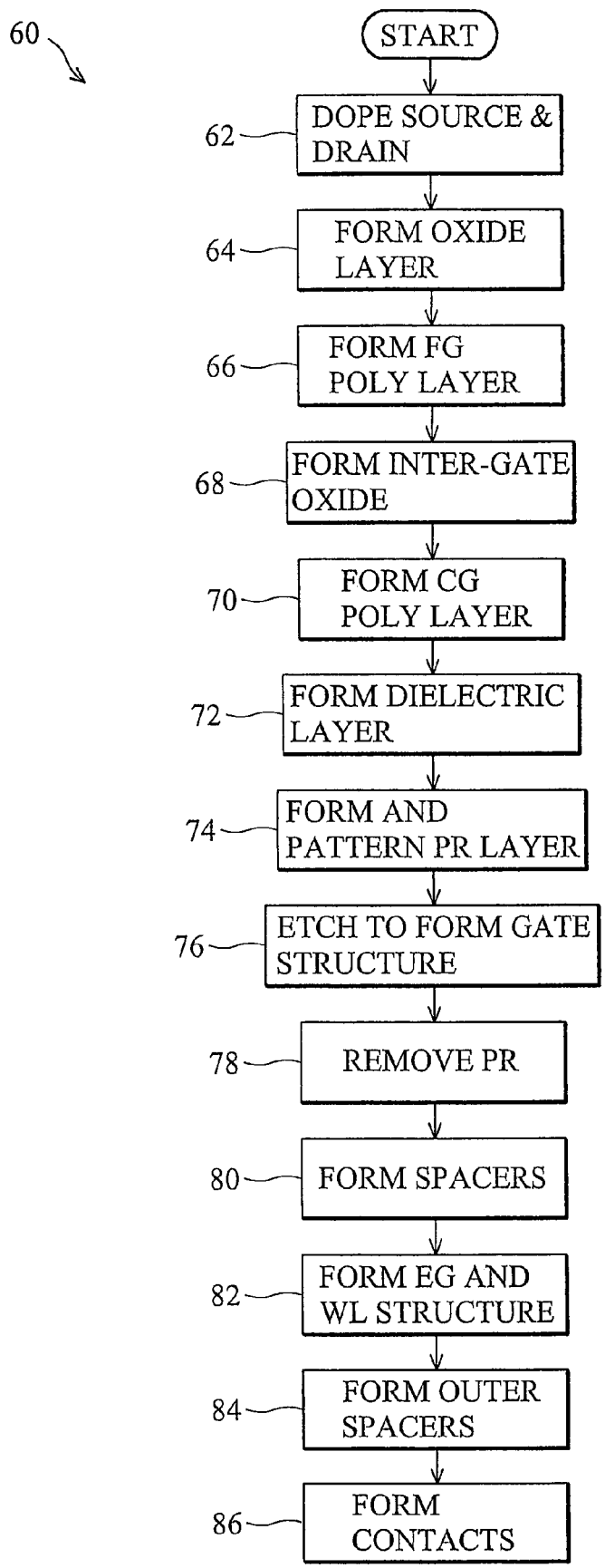
FIG. 3 is a flow diagram illustrating a typical method 60 of fabricating a flash memory cell such as the flash cell shown in FIG. 2.

As should be apparent, the structure of semiconductor device 800 is substantially similar to the semiconductor device 400 of FIG. 4, and similar features have been numbered analogously. To complete the fabrication to the point shown in FIG. 4, for example, the interior oxide layer is added, and a poly layer is formed and then reduced to create the erase gate and wordline structures. A source region and the drain regions may be added at various times in the fabrication sequence as a matter of design preference, and for simplicity are not illustrated in FIGS. 8a though 8j. Although not shown in FIG. 4 or 8a though 8j, contact regions may also be added (see, for example, contacts 37, 47, and 57 shown in FIG. 2).

FIGS. 9a through 9h are a sequence of side views illustrating in cross-section the configuration of semiconductor device 900 at various stages during fabrication according to another embodiment of the present invention. In this embodiment, a hard mask etching step results in the configuration illustrated in FIG. 9a. As should be apparent, the configuration of semiconductor device 900 at this stage of fabrication is substantially the same as that of semiconductor device 800 shown in FIG. 8c. The same process steps in the sequence described above therefore may have been used to arrive at this configuration, although this is not necessarily the case. Similar features are analogously numbered.

Figure 9A:
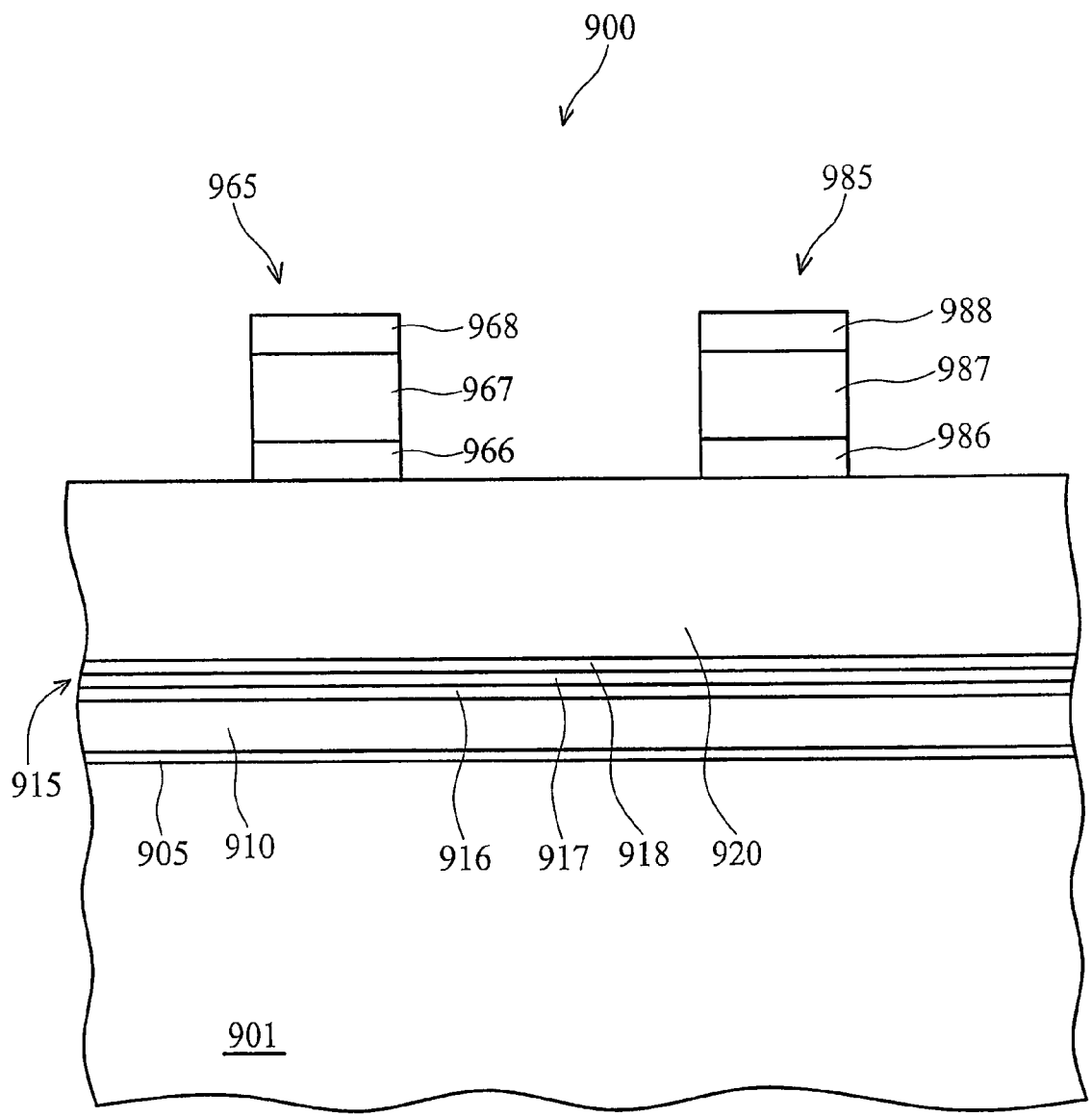
FIGS. 9a through 9h are a sequence of side views illustrating in cross-section the configuration of semiconductor device at various stages during fabrication according to another embodiment of the present invention.
Figure 9B:
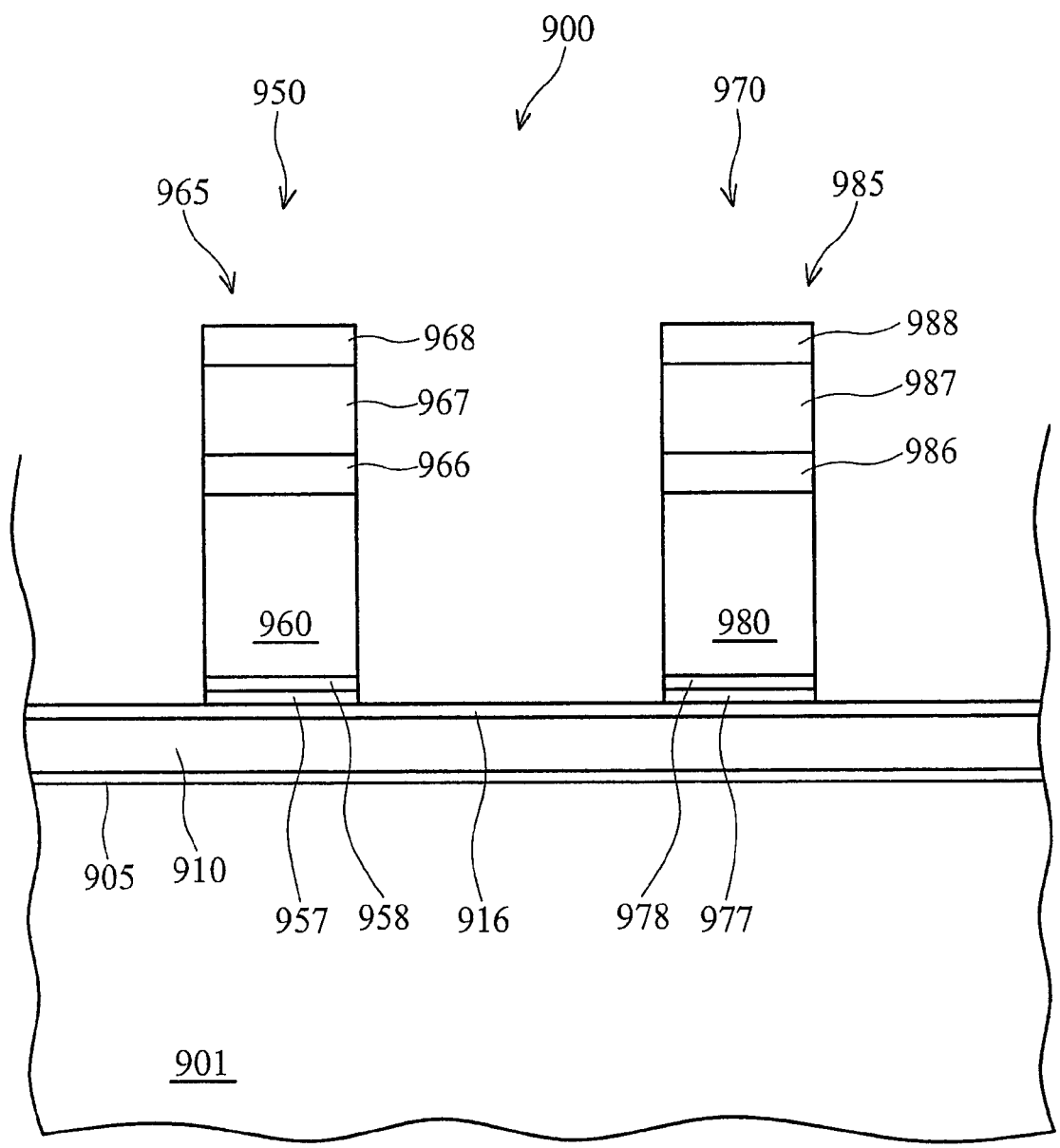
Figure 9C:
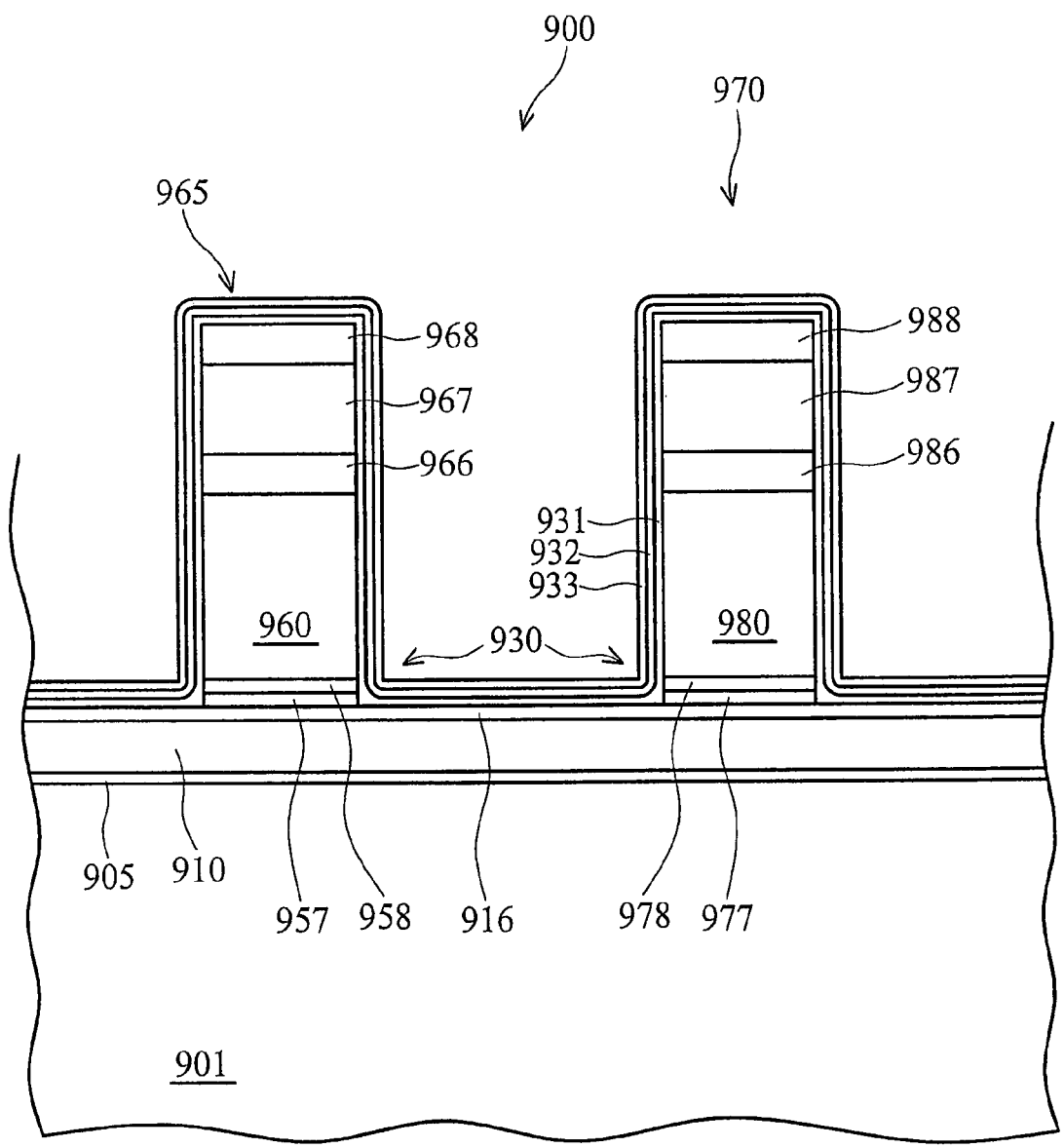
Figure 9D:
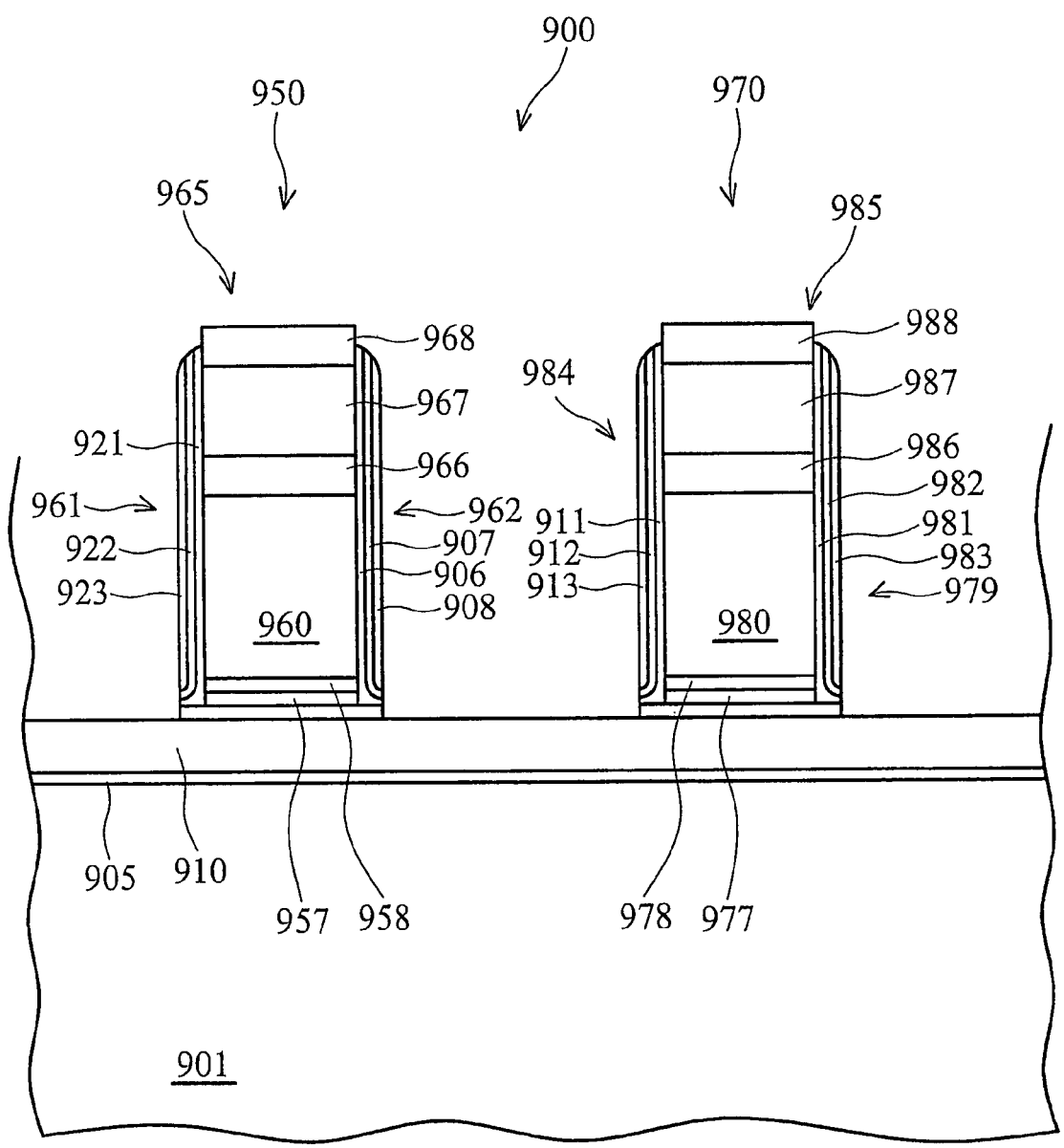

Returning to the embodiment of FIGS. 9a through 9h, an etching process is then performed to remove those portions of the control gate poly layer 920 that are not to be part of the gate structures, as well as the oxide layer 918 and nitride layer 917 disposed directly under the removed poly portions. The resulting configuration is shown in FIG. 9b. A spacer dielectric layer 930 is then formed. As shown in FIG. 9c, spacer dielectric layer 930 in this embodiment includes in this embodiment an oxide layer 931, a nitride layer 932, and an oxide layer 933, formed in that order. An etching of spacer dielectric layer 930 is then performed, resulting in the configuration shown in FIG. 9d.

Figure 9E:
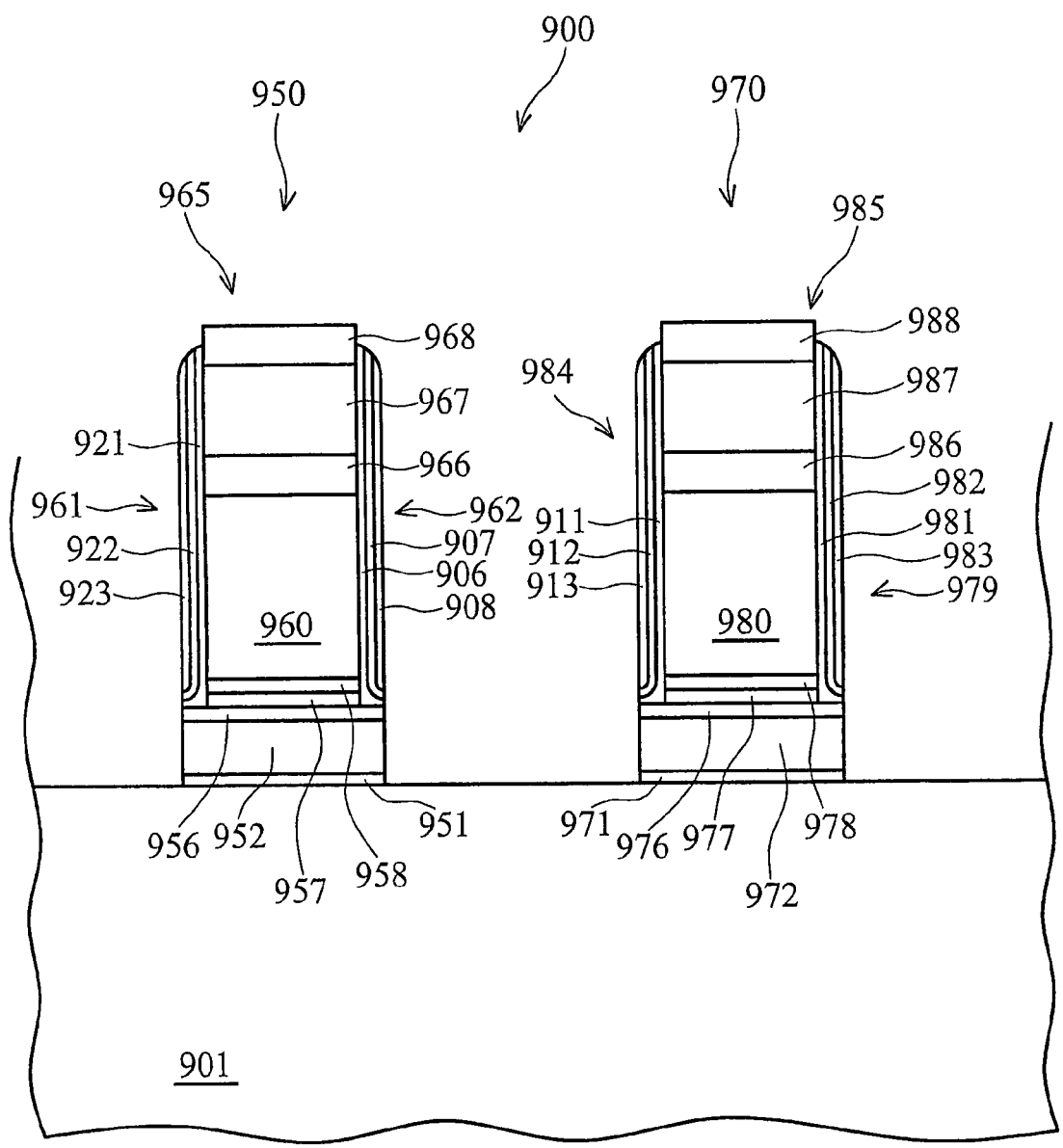
Figure 9F:
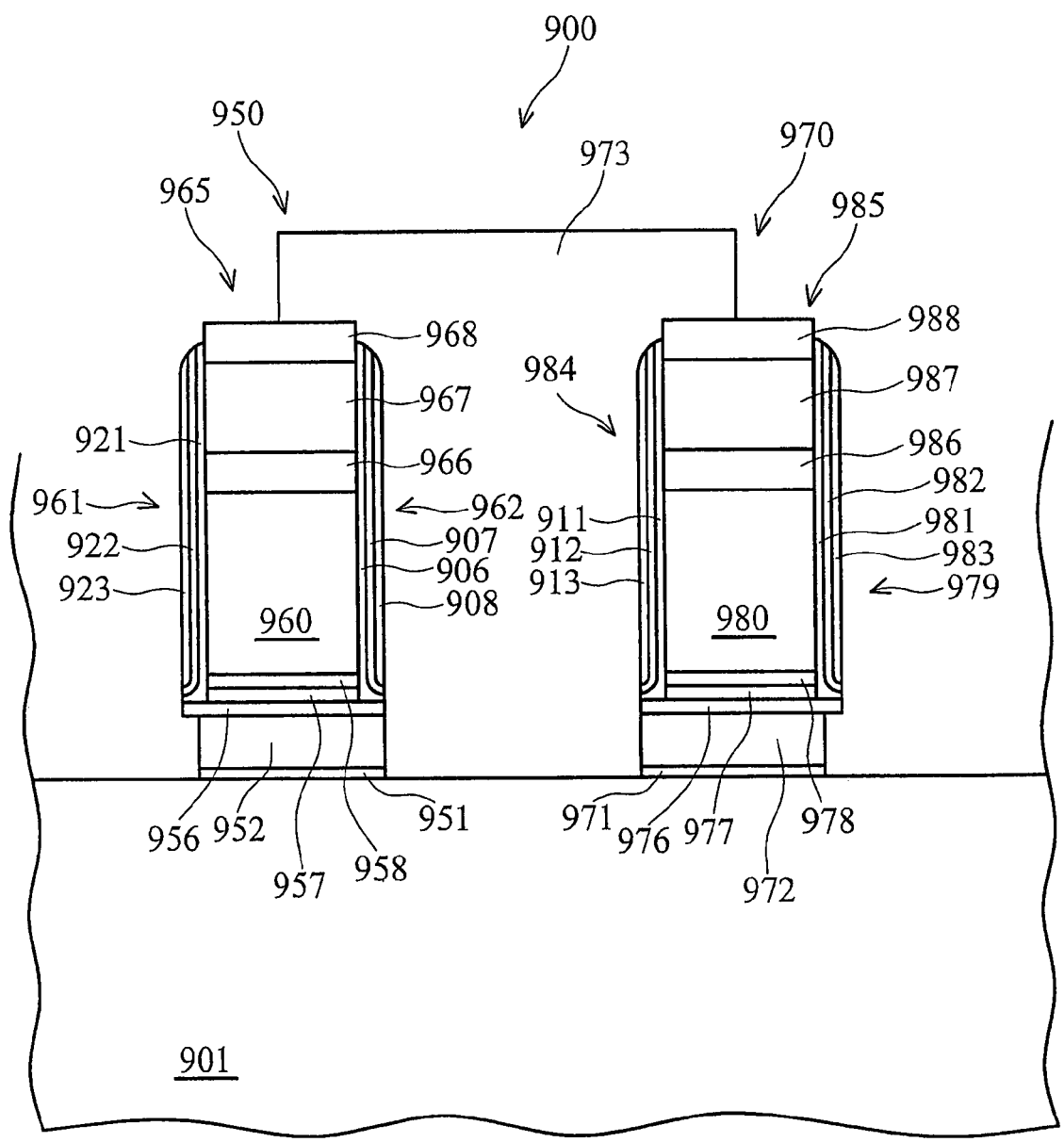

In this embodiment, a poly etch is then performed, removing those portions of the floating gate layer 910 to create floating gates 952 and 972, as shown in FIG. 9e. A photoresist layer 973 may then be formed and patterned to protect the interior region so that the exposed exterior sides of the respective floating gates 952 and 972 may be etched back laterally. This lateral etching in effect undercuts the immediately adjacent portion of the spacer dielectric layer, though in this embodiment the etching is stopped before the exterior edges of floating gates 952 and 972 moves inside a vertical plane defined by the edge of the respective control gates 960 or 980. The resulting configuration is shown in FIG. 9f.

Figure 9G:
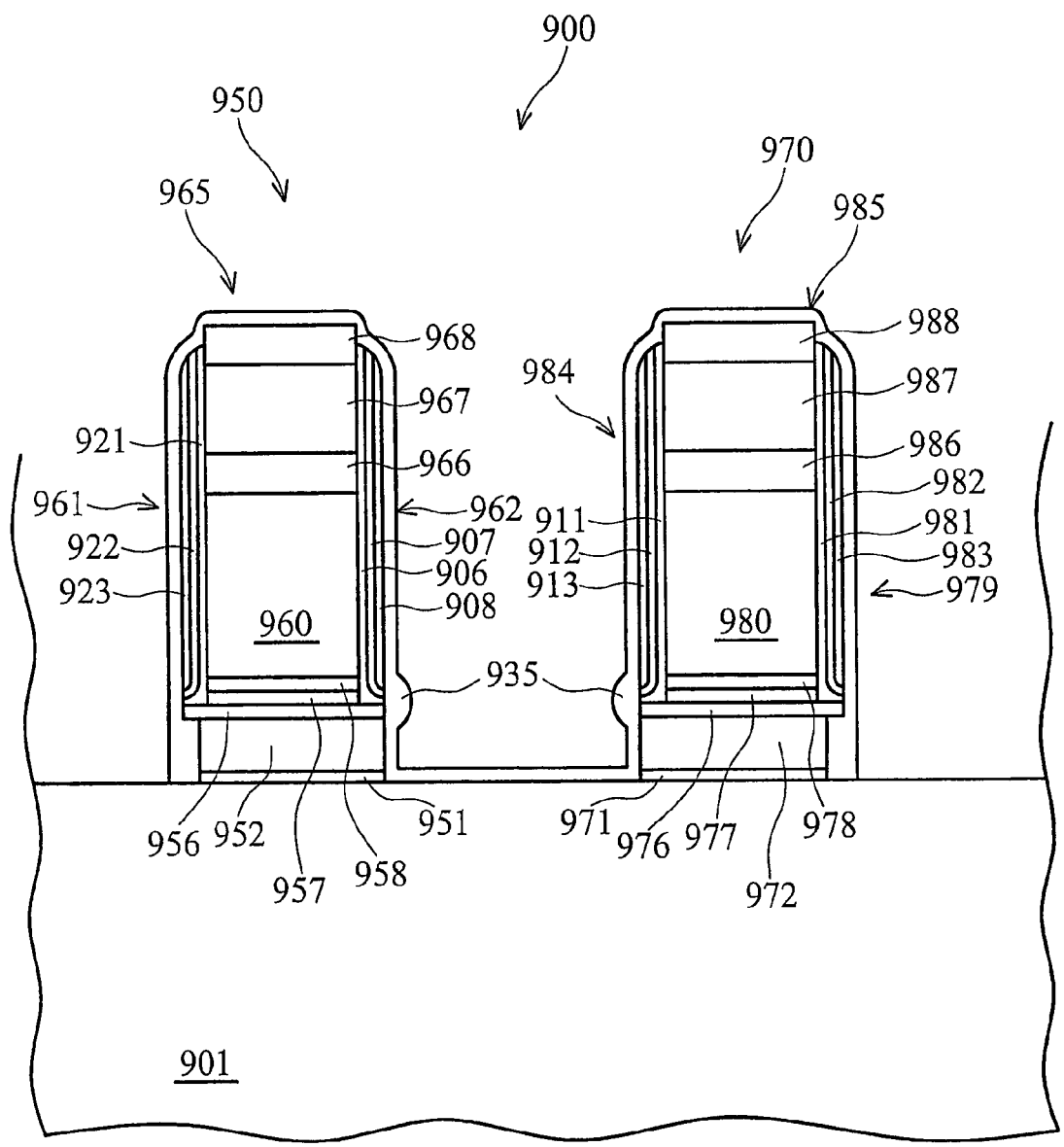
Figure 9H:
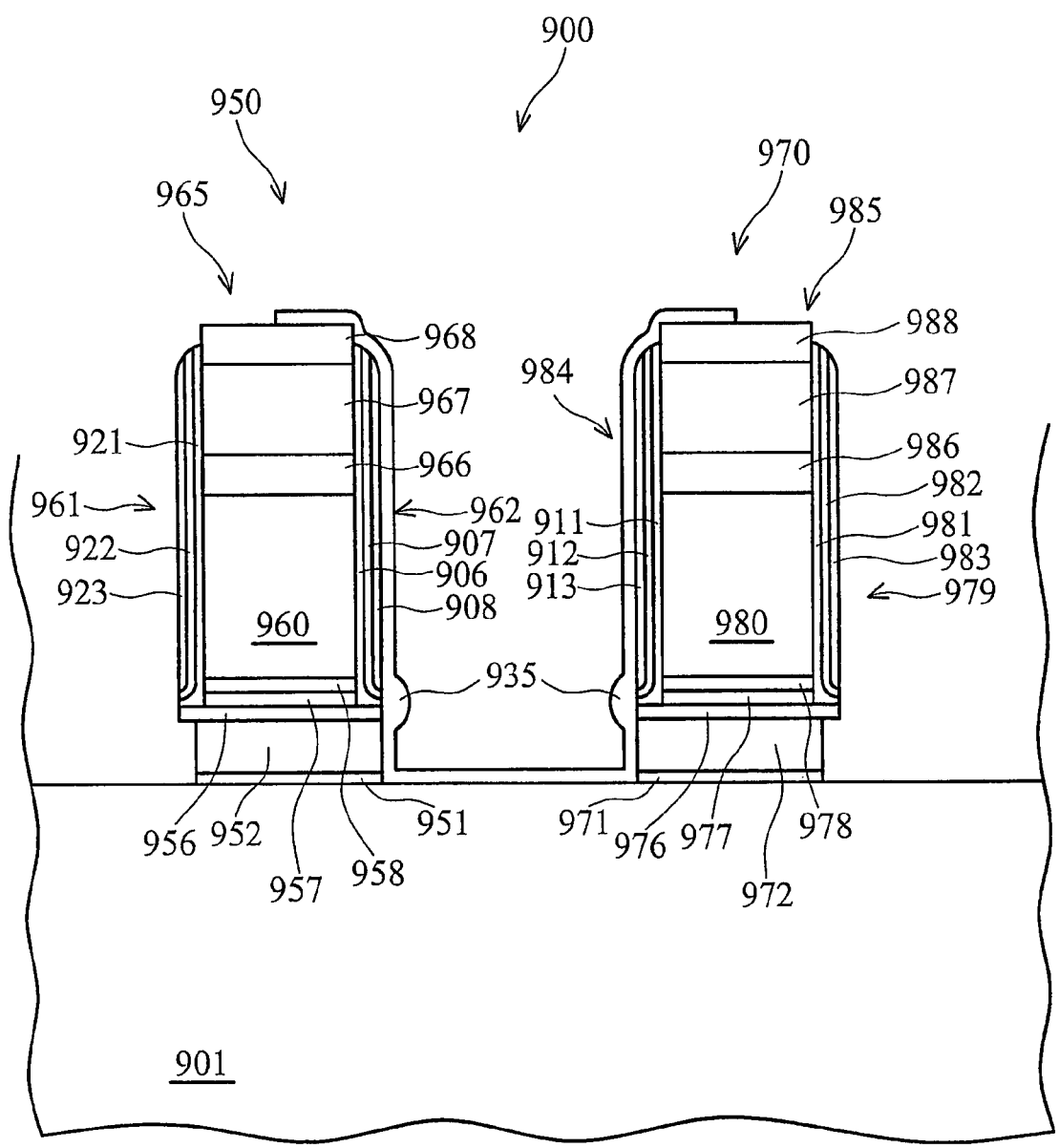

In the embodiment of FIG. 9a through 9h, the remaining photoresist is then removed, for example by an ashing process. An oxide layer 935 may then be deposited. In accordance with a preferred embodiment of the present invention, an oxide layer is then added using a hot thermal oxide (HTO) deposition process, as shown in FIG. 9g. Note that although this oxide layer is relatively uniform and conformal, it represents an enhancement of the outer oxide layer of the dielectric spacer layer where it remains. Note also that the process described above effectively creates an overhang or outward discontinuity in the oxide layer's linearity.

In this embodiment, a dry etch process is now performed to reduce the thickness of the oxide layer to approximately 150 Å. A photoresist layer (not shown) is then added and patterned so that it covers the exterior vertical side of each gate structure and approximately one-half of the top. A wet etching process may then be used to remove the unprotected oxide layer. The remaining photoresist is then removed, and a further oxide layer deposited. In a preferred embodiment, this oxide layer deposition consists of both an RTO and an HTO step. The RTO process may, for example, be used to deposit a layer of about 20 Å, and the subsequent HTO process is used to add approximately 145 Å.

In the embodiment of FIGS. 9a through 9h, a photoresist layer (not shown) is again formed and patterned, this time leaving exposed the exterior portions of the gate structure. An etching process is then performed; in a preferred embodiment, this includes a dry etching step and a wet etching step. The remaining photoresist is then removed, and the resulting configuration illustrated in FIG. 9h. The process according to this embodiment of the present invention results in a semiconductor device having two gate structures that each have a floating gate and a control gate, where an oxide layer on the exterior side of the control gate portion is substantially uniform in thickness. This configuration, substantially similar to that illustrated in FIG. 5, has been found to yield a definite improvement in RTV failure performance.

Although the present invention and its advantages have been described in detail, it should be understood that various changes, substitutions and alterations could be made herein without departing from the spirit and scope of the invention as defined by the appended claims. For example, it will be readily understood by those skilled in the art that the materials used may be varied while remaining within the scope of the present invention. Moreover, the methods described herein may be varied in any logical order, or steps added or removed where not necessary to the recited embodiment.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for fabricating a semiconductor device, comprising:
    forming at least one hard mask, each hard mask comprising an oxide layer disposed between an upper nitride layer and a lower nitride layer;
    reducing a lateral dimension of the hard mask oxide layer to less than the corresponding lateral dimension of the hard mask upper nitride layer;
    forming a gate structure on a substrate using each hard mask, each gate structure comprising a first spacer layer, the first spacer layer conforming to the dimensions of the hard mask oxide layer.

2. The method of claim 1, wherein the at least one hard mask comprises a plurality of hard masks.

3. The method of claim 1, wherein the first spacer layer comprises a nitride layer disposed between an inner oxide layer and an outer oxide layer.

4. The method of claim 1, further comprising:
    forming a gate dielectric layer on a substrate; and
    forming a first gate layer on the gate dielectric layer prior to forming the at least one hard mask.

5. The method of claim 4, further comprising:
    forming an inter-gate dielectric on the first gate layer;
    forming a second gate layer on the inter-gate dielectric prior to forming the at least one hard mask.

6. The method of claim 1, wherein forming the gate structure comprises etching the first gate layer and etching the second gate layer to remove portions thereof that are not protected by the hard mask.

7. The method of claim 6, wherein the etching of the first gate layer and the etching of the second gate layer is done in a single etch step.

8. The method of claim 6, wherein reducing the lateral dimension of the hard mask oxide layer comprises performing a DHF (dilute hydrofluoric acid) dip.

9. The method of claim 8, wherein the DHF dip produces an I-shaped hard mask.

10. The method of claim 6, wherein removing portions of the first gate layer exposes at least one side, and further comprising performing a lateral etch to reduce a lateral dimension thereof.

11. The method of claim 10, further comprising forming an oxide layer on the reduced side of the first gate layer.

12. The method of claim 1, wherein the semiconductor device is a flash cell.

* * * * *